US012575327B2

(12) United States Patent
Kagawa et al.

(10) Patent No.: US 12,575,327 B2
(45) Date of Patent: Mar. 10, 2026

(54) PIEZOELECTRIC FILM CAPABLE OF PREVENTING SHORT CIRCUIT CAUSED BY ELECTRODE PROTRUDING FROM PIEZOELECTRIC LAYER, AND METHOD OF PRODUCING PIEZOELECTRIC FILM

(71) Applicant: FUJIFILM Corporation, Tokyo (JP)

(72) Inventors: Yusuke Kagawa, Minamiashigara (JP); Kazuo Hiraguchi, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 984 days.

(21) Appl. No.: 17/717,226

(22) Filed: Apr. 11, 2022

(65) Prior Publication Data

US 2022/0238787 A1     Jul. 28, 2022

Related U.S. Application Data

(63) Continuation of application No. PCT/JP2020/037813, filed on Oct. 6, 2020.

(30) Foreign Application Priority Data

Oct. 16, 2019     (JP) ................................. 2019-189074

(51) Int. Cl.
*H10N 30/00*          (2023.01)
*H10N 30/85*          (2023.01)
(Continued)

(52) U.S. Cl.
CPC ......... *H10N 30/704* (2024.05); *H10N 30/852* (2023.02); *H10N 30/872* (2023.02); *H10N 30/883* (2023.02)

(58) Field of Classification Search
CPC .. H10N 30/704; H10N 30/852; H10N 30/872; H10N 30/883; H10N 30/02;
(Continued)

(56) References Cited

U.S. PATENT DOCUMENTS

| 4,443,730 A | 4/1984 | Kitamura et al. |
| 10,341,774 B2 * | 7/2019 | Inoue ........................ H04R 5/02 |

(Continued)

FOREIGN PATENT DOCUMENTS

| CN | 1568111 A | 1/2005 |
| CN | 1784792 A | 6/2006 |

(Continued)

OTHER PUBLICATIONS

International Preliminary Report on Patentability and Written Opinion of the International Searching Authority for International Application No. PCT/JP2020/037813, dated Apr. 28, 2022, with an English translation.

(Continued)

*Primary Examiner* — Emily P Pham

(74) *Attorney, Agent, or Firm* — Birch, Stewart, Kolasch & Birch, LLP

(57)     ABSTRACT

An object of the present invention is to provide a piezoelectric film capable of preventing a short circuit caused by electrodes protruding from a piezoelectric layer in the piezoelectric film having electrode layers and protective layers on both surfaces of the piezoelectric layer, and a method of producing the piezoelectric film. The object can be achieved by the piezoelectric film that includes a laminated film including a piezoelectric layer, an electrode layer provided on each of both surfaces of the piezoelectric layer, and a protective layer covering the electrode layer, and an insulating end surface coating layer which covers at least a part of an end surface of the laminated film.

16 Claims, 8 Drawing Sheets

(51) Int. Cl.
  *H10N 30/87* (2023.01)
  *H10N 30/88* (2023.01)
(58) Field of Classification Search
  CPC ...... H10N 30/06; H10N 30/87; H10N 30/875;
  H04R 17/005; H04R 17/00
  See application file for complete search history.

(56) References Cited

U.S. PATENT DOCUMENTS

| | | | |
|---|---|---|---|
| 2003/0062912 A1* | 4/2003 | Nakajima ........... | H10N 30/045 |
| | | | 324/727 |
| 2006/0061237 A1 | 3/2006 | Ikeda et al. | |
| 2007/0182288 A1 | 8/2007 | Nakamura et al. | |
| 2016/0008852 A1 | 1/2016 | Miyoshi | |
| 2016/0014527 A1 | 1/2016 | Miyoshi et al. | |
| 2017/0331030 A1 | 11/2017 | Inoue et al. | |
| 2018/0160248 A1 | 6/2018 | Murakami et al. | |
| 2020/0176668 A1 | 6/2020 | Ogawa | |

FOREIGN PATENT DOCUMENTS

| | | |
|---|---|---|
| CN | 105304856 A | 2/2016 |
| JP | 63-226894 A | 9/1988 |
| JP | 6-268274 A | 9/1994 |
| JP | 11-333635 A | 12/1999 |
| JP | 2004-234995 A | 8/2004 |
| JP | 2004-351579 A | 12/2004 |
| JP | 2004-363489 A | 12/2004 |
| JP | 2007-243150 A | 9/2007 |
| JP | 2008-218378 A | 9/2008 |
| JP | 2014-209724 A | 11/2014 |
| JP | 2016-15354 A | 1/2016 |
| JP | 2016-72565 A | 5/2016 |
| JP | 2019-161213 A | 9/2019 |
| WO | WO 2014/157006 A1 | 10/2014 |
| WO | WO 2016/121765 A1 | 8/2016 |
| WO | WO 2017/018313 A1 | 2/2017 |
| WO | WO 2019/093092 A1 | 5/2019 |

OTHER PUBLICATIONS

International Search Report for International Application No. PCT/JP2020/037813, dated Dec. 22, 2020, with an English translation.
Chinese Search Report for Chinese Application No. 202080070616.X, dated Nov. 22, 2024.
Chinese Office Action and Search Report for corresponding Chinese Application No. 202080070616.X, dated May 28, 2025, with English translation.
Chinese Office Action for corresponding Chinese Application No. 202080070616.X, dated Nov. 22, 2024, with English translation.
Japanese Office Action for corresponding Japanese Application No. 2021-552334, dated Jul. 4, 2023, with English translation.
Korean Office Action for corresponding Korean Application No. 10-2022-7011197, dated Dec. 14, 2023, with an English translation.
Extended European Search Report for corresponding European Application No. 20877551.0, dated Nov. 21, 2022.
Japanese Office Action for corresponding Japanese Application No. 2021-552334, dated Nov. 29, 2022, with English translation.
Chinese Office Action for corresponding Chinese Application No. 202080070616.X, dated Sep. 24, 2025, with English translation.

* cited by examiner

PIEZOELECTRIC FILM CAPABLE OF PREVENTING SHORT CIRCUIT CAUSED BY ELECTRODE PROTRUDING FROM PIEZOELECTRIC LAYER, AND METHOD OF PRODUCING PIEZOELECTRIC FILM

CROSS-REFERENCE TO RELATED APPLICATIONS

This application is a Continuation of PCT International Application No. PCT/JP2020/037813 filed on Oct. 6, 2020, which claims priority under 35 U.S.C. § 119(a) to Japanese Patent Application No. 2019-189074 filed on Oct. 16, 2019. The above application is hereby expressly incorporated by reference, in its entirety, into the present application.

BACKGROUND OF THE INVENTION

1. Field of the Invention

The present invention relates to a piezoelectric film used for an electroacoustic conversion film or the like and a method of producing the piezoelectric film.

2. Description of the Related Art

With reduction in thickness and weight of displays such as liquid crystal displays or organic electroluminescence (EL) displays, speakers used in these thin displays are also required to be thinner and lighter. Further, with the development of flexible displays formed of flexible substrates such as plastics, speakers used in the flexible displays are also required to be flexible.

Examples of typical shapes of speakers of the related art include a funnel-like so-called cone shape and a spherical dome shape. However, in a case where such a speaker is intended to be incorporated in the above-described thin display, there is a concern that the lightness and the flexibility of the speaker are impaired because the speaker cannot be sufficiently made thin. Further, in a case where the speaker is attached externally, it is troublesome to carry the speaker.

Therefore, as a speaker that is thin and can be integrated into a thin display or a flexible display without impairing lightness and flexibility, a sheet-like piezoelectric film having flexibility and a property of stretching and contracting in response to an applied voltage has been suggested.

For example, the applicant suggested a piezoelectric film (electroacoustic conversion film) disclosed in WO2017/018313A as a sheet-like piezoelectric film that has flexibility and can stably reproduce a high-quality sound.

For example, the piezoelectric film disclosed in WO2017/018313A includes a polymer-based piezoelectric composite material (piezoelectric layer) obtained by dispersing piezoelectric particles in a viscoelastic matrix consisting of a polymer material having a viscoelasticity at room temperature, an electrode layer formed on each of both surfaces of the polymer-based piezoelectric composite material, and a protective layer formed on a surface of the electrode layer. Further, in the piezoelectric film disclosed in WO2017/018313A, an intensity ratio al of a (002) plane peak intensity and a (200) plane peak intensity derived from the piezoelectric particles ((002) plane peak intensity/((002) plane peak intensity+(200) plane peak intensity)) in a case where the polymer-based piezoelectric composite material is evaluated by an X-ray diffraction method is 0.6 or greater and less than 1.

SUMMARY OF THE INVENTION

Such a piezoelectric film functions as a piezoelectric speaker by, for example, being maintained in a bent state. That is, by maintaining the piezoelectric film in a bent state and applying a driving voltage to the electrode layer, the polymer-based piezoelectric composite material stretches and contracts due to the stretch and contraction of the piezoelectric particles and the piezoelectric film vibrates to absorb the stretch and contraction. The piezoelectric film vibrates the air through this vibration and converts an electric signal into a sound.

The piezoelectric film has a configuration in which electrode layers are provided on both surfaces of the piezoelectric layer and protective layers are provided on both surfaces of thereof. In such a piezoelectric film, the piezoelectric layer has a thickness of, for example, preferably 300 μm or less, which is extremely thin.

Therefore, in a case where the electrode layers formed on both surfaces of the piezoelectric layer protrude from the end portions of the piezoelectric layer, the electrodes on both surfaces of the piezoelectric layer are short-circuited, and the piezoelectric film is not operated properly.

An object of the present invention is to solve such problems of the related art and to provide a piezoelectric film which includes a piezoelectric layer, and electrode layers and protective layers provided on both surfaces of the piezoelectric layer and is capable of preventing a short circuit caused by electrodes protruding from the piezoelectric layer, and a method of producing the piezoelectric film.

In order to solve the above-described problem, the present invention has the following configurations.

[1] A piezoelectric film comprising: a laminated film which includes a piezoelectric layer, an electrode layer provided on each of both surfaces of the piezoelectric layer, and a protective layer covering the electrode layer; and an insulating end surface coating layer which covers at least a part of an end surface of the laminated film.

[2] The piezoelectric film according to [1], in which the end surface coating layer covers the entire end surface of the laminated film.

[3] The piezoelectric film according to [1] or [2], further comprising: a conductive connection member which penetrates the protective layer and is connected to the electrode layer; and a lead-out electrode which is electrically connected directly or indirectly to the connection member and extends to an outside of the laminated film in a plane direction.

[4] The piezoelectric film according to [3], further comprising: an insulating electrode insulation member which is provided between the lead-out electrode and the laminated film and protrudes from an end portion of the laminated film.

[5] The piezoelectric film according to any one of [1] to [4], further comprising: an insulating interlayer insulation member which is provided on at least a part of an end portion of the laminated film in at least one of a space between the piezoelectric layer and one electrode layer or a space between the piezoelectric layer and the other electrode layer.

[6] The piezoelectric film according to [5], in which at least a part of the interlayer insulation member protrudes from the end portion of the laminated film.

[7] The piezoelectric film according to [5] or [6], in which the interlayer insulation member is provided on the end portion of the laminated film on a side where the electrode is led out from the laminated film.

[8] The piezoelectric film according to any one of [5] to [7], in which the interlayer insulation member is provided on the entire end portion of the laminated film.

[9] The piezoelectric film according to any one of [1] to [8], in which the piezoelectric layer is a polymer-based piezoelectric composite material that contains piezoelectric particles in a matrix containing a polymer material.

[10] A method of producing a piezoelectric film, comprising: a film preparation step of preparing a laminated film which includes a piezoelectric layer, an electrode layer provided on each of both surfaces of the piezoelectric layer, and a protective layer covering the electrode layer; a coating layer formation step of covering at least a part of an end surface of the laminated film to form an insulating end surface coating layer; and an energization step of energizing the electrode layer of the laminated film after performing the coating layer formation step.

[11] The method of producing a piezoelectric film according to [10], in which in the coating layer formation step, the end surface coating layer is formed on the entire end surface of the laminated film.

[12] The method of producing a piezoelectric film according to [10] or [11], further comprising: a through-hole formation step of forming a through-hole that extends to the electrode layer on at least one protective layer of the laminated film; a connection member formation step of forming a conductive connection member that penetrates the through-hole and is connected to the electrode layer; and an electrode formation step of forming a lead-out electrode that is connected to the connection member and extends to an outside of the laminated film in a plane direction.

[13] The method of producing a piezoelectric film according to any one of [10] to [12], in which the film preparation step includes a piezoelectric layer formation step of forming the piezoelectric layer on a surface of the electrode layer of a second laminate that has the protective layer and the electrode layer, and a lamination step of laminating a first laminate that has the electrode layer and the protective layer on a surface of the piezoelectric layer such that the electrode layer and the piezoelectric layer face each other.

According to the present invention, in the piezoelectric film having electrode layers and protective layers on both surfaces of a piezoelectric layer, it is possible to prevent a short circuit caused by electrodes protruding from the piezoelectric layer.

DESCRIPTION OF THE PREFERRED EMBODIMENTS

Figure 1:
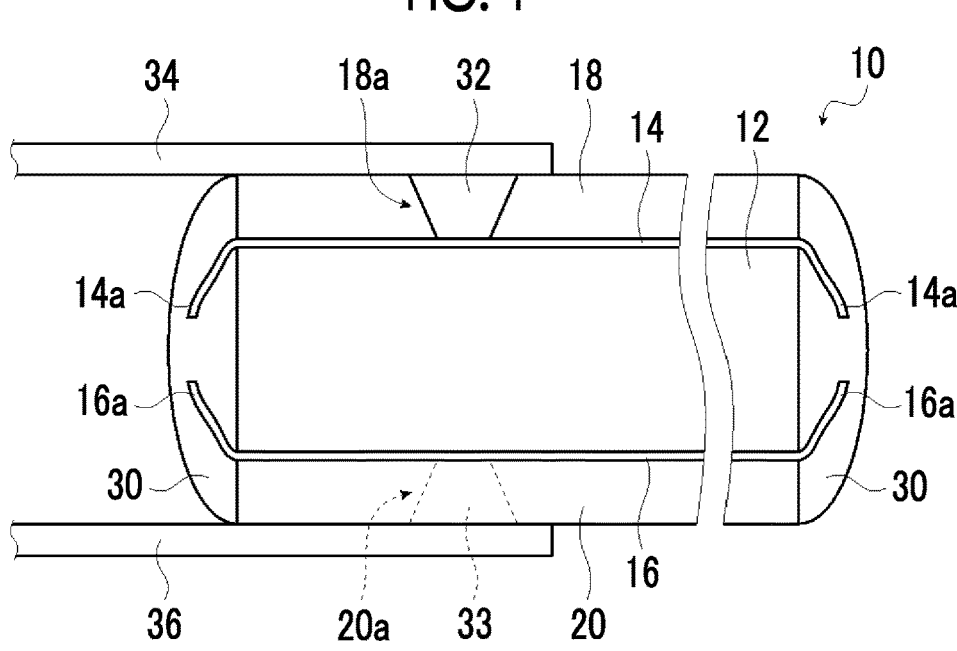
FIG. 1 is a cross-sectional view conceptually illustrating an example of a piezoelectric film according to the embodiment of the present invention.

Hereinafter, a piezoelectric film and a method of producing the piezoelectric film of the present invention will be described in detail based on preferred embodiments shown in the accompanying drawings.

Descriptions of the constituent requirements described below may be made based on representative embodiments of the present invention, but the present invention is not limited to such embodiments. In addition, the drawings shown below are conceptual views for describing the present invention, and the thickness of each layer, the size of constituent members, the positional relationship between constituent members, and the like are different from the actual values.

In the present specification, a numerical range shown using "to" indicates a range including numerical values described before and after "to" as a lower limit and an upper limit.

A piezoelectric film according of the embodiment of the present invention has a configuration in which an end surface of a laminated film which includes a piezoelectric layer, an electrode layer provided on each of both surfaces of the piezoelectric layer, and a protective layer covering the electrode layer is coated with an end surface coating layer.

In the following description, such a laminated film is also denoted as "a laminated film in which electrode layers and protective layers are laminated on both surfaces of the piezoelectric layer".

The piezoelectric film according to the embodiment of the present invention is used, for example, as an electroacoustic conversion film. Specifically, the piezoelectric film according to the embodiment of the present invention is used as a vibration plate of an electroacoustic converter such as a piezoelectric speaker, a microphone, or a voice sensor.

In an electroacoustic converter, in a case where the piezoelectric film is stretched in the in-plane direction due to application of a voltage to the piezoelectric film, the piezoelectric film moves upward (in the radiation direction of the sound) in order to absorb the stretched part. On the contrary, in a case where the piezoelectric film is contracted in the in-plane direction due to application of a voltage to the piezoelectric film, the piezoelectric film moves downward in order to absorb the contracted part.

The electroacoustic converter converts vibration (sound) and an electric signal using vibration caused by repeated stretch and contraction of the piezoelectric film. Such an electroacoustic converter is used to, for example, input an electric signal to the piezoelectric film to reproduce a sound using vibration in response to the electric signal, convert the vibration of the piezoelectric film due to the reception of a sound wave to an electric signal, impart a tactile sensation using vibration, and transport an object.

Specific examples of the applications of the electroacoustic converter formed of the piezoelectric film according to the embodiment of the present invention include various acoustic devices, for example, speakers such as full-range speakers, tweeters, squawkers, and woofers, speakers for headphones, noise cancellers, microphones, and pickups (sensors for musical instruments) used for musical instruments such as guitars. Further, the piezoelectric film according to the embodiment of the present invention is a nonmagnetic material and thus can be suitably used as a noise canceller for MRI among noise cancellers.

Further, the electroacoustic converter formed of the piezoelectric film according to the embodiment of the present invention is thin, light, and bendable, and thus can be suitably used as wearable products such as hats, mufflers, and clothes, thin displays such as televisions and digital signage, buildings having a function as an acoustic device, ceilings of automobiles, curtains, umbrellas, wallpaper, windows, beds, and the like.

FIG. 1 is a cross-sectional view conceptually illustrating an example of the piezoelectric film according to the embodiment of the present invention. In FIG. 1 and the like, hatching is omitted to simplify the drawing and clearly show the configuration.

In the following description, "cross section" indicates a cross section of the piezoelectric film in the thickness direction unless otherwise specified. The thickness direction of the piezoelectric film is the lamination direction of each layer.

The piezoelectric film according to the embodiment of the present invention has a configuration in which the end surface of the laminated film obtained by laminating electrode layers and protective layers on both surfaces of a piezoelectric layer is coated with an end surface coating layer.

A laminated film of a piezoelectric film 10 illustrated in FIG. 1 includes a piezoelectric layer 12, a first electrode layer 14 laminated on one surface of the piezoelectric layer 12, a first protective layer 18 laminated on the first electrode layer 14, a second electrode layer 16 laminated on the other surface of the piezoelectric layer 12, and a second protective layer 20 laminated on the second electrode layer 16.

The piezoelectric film 10 has a configuration in which the entire end surface of such a laminated film is coated with an insulating end surface coating layer 30.

Further, the piezoelectric film 10 has a through-hole 18a formed such that the first protective layer 18 penetrates to the first electrode layer 14. The through-hole 18a is provided with a conductive first connection member 32 connected to the first electrode layer 14. Further, a first lead-out electrode 34 that is connected to the first connection member 32 and connects the piezoelectric film 10 to an external power supply is provided.

The second protective layer 20 also has an identical through-hole 20a, and the through-hole 20a is provided with a conductive second connection member 33. Similarly, a second lead-out electrode 36 that is connected to the second connection member 33 and connects the piezoelectric film 10 to an external power supply is also provided.

In the piezoelectric film 10 according to the embodiment of the present invention, various known piezoelectric layers can be used as the piezoelectric layer 12.

Figure 2:
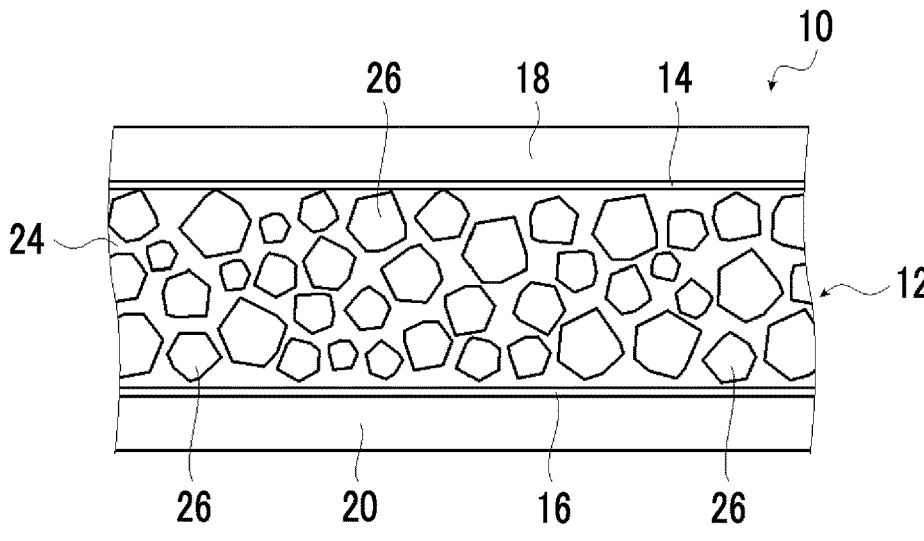
FIG. 2 is a view conceptually illustrating an example of a piezoelectric layer used in the piezoelectric film according to the embodiment of the present invention.

In the piezoelectric film 10 according to the embodiment of the present invention, it is preferable that the piezoelectric layer 12 is a polymer-based piezoelectric composite material containing piezoelectric particles 26 in the polymer matrix 24 which contains a polymer material, as conceptually illustrated in FIG. 2.

Here, it is preferable that the polymer-based piezoelectric composite material (piezoelectric layer 12) satisfies the following requirements. Further, in the present invention, room temperature is in a range of 0° C. to 50° C.

(i) Flexibility

For example, in a case of being gripped in a state of being loosely bent like a document such as a newspaper or a magazine as a portable device, the piezoelectric film is continuously subjected to large bending deformation from the outside at a relatively slow vibration of less than or equal to a few Hz. In this case, in a case where the polymer-based piezoelectric composite material is hard, a large bending stress is generated to that extent, and a crack is generated at the interface between a polymer matrix and piezoelectric particles, which may lead to breakage. Accordingly, the polymer-based piezoelectric composite material is required to have suitable flexibility. In addition, in a case where strain energy is diffused into the outside as heat, the stress is able to be relieved. Therefore, the polymer-based piezoelectric composite material is required to have a suitably large loss tangent.

(ii) Acoustic Quality

In a speaker, the piezoelectric particles vibrate at a frequency of an audio band of 20 Hz to 20 kHz, and the vibration energy causes the entire vibration plate (polymer-based piezoelectric composite material) to vibrate integrally so that a sound is reproduced. Therefore, in order to increase the transmission efficiency of the vibration energy, the polymer-based piezoelectric composite material is required to have appropriate hardness. In addition, in a case where the frequencies of the speaker are smooth as the frequency characteristic thereof, an amount of change in acoustic quality in a case where the lowest resonance frequency $f_0$ is changed in association with a change in the curvature of the speaker decreases. Therefore, the loss tangent of the polymer-based piezoelectric composite material is required to be suitably large.

It is known that the lowest resonance frequency $f_0$ of the vibration plate for a speaker is represented by the following equation. Here, s represents the stiffness of the vibration system and m represents the mass.

$$\text{Lowest resonance frequency: } f_0 = \frac{1}{2\pi}\sqrt{\frac{s}{m}} \qquad \text{[Mathematical Formula 1]}$$

Here, as the degree of curvature of the piezoelectric film, that is, the radius of curvature of the curved portion increases, the mechanical stiffness s decreases, and thus the lowest resonance frequency $f_0$ decreases. That is, the acoustic quality (the volume and the frequency characteristics) of the speaker changes depending on the radius of curvature of the piezoelectric film.

That is, the polymer-based piezoelectric composite material is required to exhibit a behavior of being rigid with respect to a vibration of 20 Hz to 20 kHz and being flexible with respect to a vibration of less than or equal to a few Hz. In addition, the loss tangent of a polymer-based piezoelectric composite material is required to be suitably large with respect to the vibration of all frequencies of 20 kHz or less.

In general, a polymer solid has a viscoelasticity relieving mechanism, and a molecular movement having a large scale is observed as a decrease (relief) in a storage elastic modulus (Young's modulus) or a maximal value (absorption) in a loss elastic modulus along with an increase in temperature or a decrease in frequency. Among these, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer-based piezoelectric composite material (piezoelectric layer 12), the polymer-based piezoelectric composite material exhibiting a behavior of being rigid with respect to a vibration of 20 Hz to 20 kHz and being flexible with respect to a vibration of less than or equal to a few Hz is realized by using a polymer material whose glass transition point is room temperature, that is, a polymer material having a viscoelasticity at room temperature as a matrix. In particular, from the viewpoint that such a behavior is suitably exhibited, it is preferable that the polymer material in which the glass transition point Tg at a frequency of 1 Hz is at room temperature is used for a matrix of the polymer-based piezoelectric composite material.

In the polymer material constituting the polymer matrix 24, it is preferable that the maximal value of a loss tangent tan δ at a frequency of 1 Hz according to a dynamic viscoelasticity test at room temperature is 0.5 or greater.

In this manner, in a case where the polymer-based piezoelectric composite material is slowly bent due to an external force, stress concentration on the interface between the polymer matrix and the piezoelectric particles at the maximum bending moment portion is relieved, and thus satisfactory flexibility can be expected.

In the polymer material constituting the polymer matrix 24, it is preferable that a storage elastic modulus (E') at a frequency of 1 Hz according to the dynamic viscoelasticity measurement is 100 MPa or greater at 0° C. and 10 MPa or less at 50° C.

In this manner, the bending moment generated in a case where the polymer-based piezoelectric composite material is slowly bent due to the external force can be reduced, and the polymer-based piezoelectric composite material can exhibit a behavior of being rigid with respect to an acoustic vibration of 20 Hz to 20 kHz.

In addition, it is more suitable that the relative dielectric constant of the polymer material constituting the polymer matrix 24 is 10 or greater at 25° C. Accordingly, in a case where a voltage is applied to the polymer-based piezoelectric composite material, a higher electric field is applied to the piezoelectric particles in the polymer matrix, and thus a large deformation amount can be expected.

However, in consideration of ensuring satisfactory moisture resistance and the like, it is suitable that the relative dielectric constant of the polymer material is 10 or less at 25° C.

Suitable examples of the polymer material that satisfies such conditions include cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, and polybutyl methacrylate.

In addition, as these polymer materials, a commercially available product such as Hybrar 5127 (manufactured by Kuraray Co., Ltd.) can be suitably used.

Among these, it is preferable to use a polymer material containing a cyanoethyl group and particularly preferable to use cyanoethylated PVA as the polymer material constituting the polymer matrix 24. That is, in the piezoelectric film 10 according to the embodiment of the present invention, it is preferable to use a polymer material containing a cyanoethyl group and particularly preferable to use cyanoethylated PVA as the polymer matrix 24 of the piezoelectric layer 12.

In the description below, the above-described polymer materials typified by cyanoethylated PVA will also be collectively referred to as the "polymer material having a viscoelasticity at room temperature".

Further, the polymer material having a viscoelasticity at room temperature may be used alone or in combination (mixture) of two or more kinds thereof.

In the piezoelectric film 10 according to the embodiment of the present invention, a plurality of polymer materials may be used in combination as necessary for the polymer matrix 24 of the piezoelectric layer 12.

That is, for the purpose of adjusting dielectric characteristics, mechanical characteristics, and the like, other dielectric polymer materials may be added to the polymer matrix 24 constituting the polymer-based piezoelectric composite material in addition to the polymer material having a viscoelasticity at room temperature as necessary.

Examples of the dielectric polymer material that can be added thereto include a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, or a polyvinylidene fluoride-tetrafluoroethylene copolymer, a polymer containing a cyano group or a cyanoethyl group such as a vinylidene cyanide-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, or cyanoethyl sorbitol, and synthetic rubber such as nitrile rubber or chloroprene rubber.

Among these, a polymer material containing a cyanoethyl group is suitably used.

Further, in the polymer matrix 24 of the piezoelectric layer 12, the number of these dielectric polymer materials is not limited to one, and a plurality of kinds of dielectric polymer materials may be added.

In addition, for the purpose of adjusting the glass transition point Tg of the polymer matrix 24, the polymer matrix 24 may contain a thermoplastic resin such as a vinyl chloride resin, polyethylene, polystyrene, a methacrylic resin, polybutene, or isobutylene, and a thermosetting resin such as a phenol resin, a urea resin, a melamine resin, an alkyd resin, or mica in addition to the dielectric polymer materials.

Further, for the purpose of improving the pressure sensitive adhesiveness, a viscosity imparting agent such as rosin ester, rosin, terpene, terpene phenol, or a petroleum resin may be added.

In the polymer matrix 24 of the piezoelectric layer 12, the addition amount in a case of adding polymer materials other than the polymer material having a viscoelasticity at room temperature is not particularly limited, but is preferably set to 30% by mass or less in terms of the proportion of the polymer materials in the matrix 24.

In this manner, the characteristics of the polymer material to be added can be exhibited without impairing the viscoelasticity relieving mechanism in the polymer matrix 24, and thus preferable results, for example, an increase in the dielectric constant, improvement of the heat resistant, and improvement of the adhesiveness between the piezoelectric particles 26 and the electrode layer can be obtained.

The polymer-based piezoelectric composite material which is the piezoelectric layer 12 contains the piezoelectric particles 26 in the polymer matrix. The piezoelectric particles 26 are dispersed in the polymer matrix and preferably uniformly (substantially uniform).

It is preferable that the piezoelectric particles 26 consist of ceramic particles having a perovskite type or wurtzite type crystal structure.

Examples of the ceramics particles constituting the piezoelectric particles 26 include lead zirconate titanate (PZT), lead lanthanum zirconate titanate (PLZT), barium titanate $(BaTiO_3)$, zinc oxide (ZnO), and a solid solution (BFBT) of barium titanate and bismuth ferrite $(BiFe_3)$.

The particle diameter of the piezoelectric particles 26 may be appropriately selected according to the size and the applications of the piezoelectric film 10. The particle diameter of the piezoelectric particles 26 is preferably in a range of 1 to 10 μm.

By setting the particle diameter of the piezoelectric particles 26 to be in the above-described range, preferable results in terms of achieving both excellent piezoelectric characteristics and flexibility can be obtained.

In the piezoelectric film 10, the ratio between the amount of the polymer matrix 24 and the amount of the piezoelectric particles 26 in the piezoelectric layer 12 may be appropriately set according to the size and the thickness of the piezoelectric film 10 in the plane direction, the applications of the piezoelectric film 10, the characteristics required for the piezoelectric film 10, and the like.

The volume fraction of the piezoelectric particles 26 in the piezoelectric layer 12 is preferably in a range of 30% to 80% and more preferably in a range of 50% to 80%.

By setting the ratio between the amount of the polymer matrix 24 and the amount of the piezoelectric particles 26 to be in the above-described range, preferable results in terms of achieving both of excellent piezoelectric characteristics and flexibility can be obtained.

In the piezoelectric film 10, the thickness of the piezoelectric layer 12 is not limited and may be appropriately set according to the size of the piezoelectric film 10, the applications of the piezoelectric film 10, the characteristics required for the piezoelectric film 10, and the like.

The thickness of the piezoelectric layer 12 is preferably in a range of 8 to 300 μm, more preferably in a range of 8 to 200 μm, still more preferably in a range of 10 to 150 μm, and particularly preferably in a range of 15 to 100 μm.

By setting the thickness of the piezoelectric layer 12 to be in the above-described range, preferable results in terms of achieving both ensuring of the rigidity and moderate elasticity can be obtained.

It is preferable that the piezoelectric layer 12 is subjected to a polarization treatment (poling) in the thickness direction. The polarization treatment will be described in detail later.

In the piezoelectric film 10 according to the embodiment of the present invention, the piezoelectric layer 12 is not limited to the polymer-based piezoelectric composite material containing the piezoelectric particles 26 in the polymer matrix 24 consisting of a polymer material having a viscoelasticity at room temperature, such as cyanoethylated PVA, as described above.

That is, in the piezoelectric film 10 according to the embodiment of the present invention, various known piezoelectric layers can be used as the piezoelectric layer.

As an example, the polymer-based piezoelectric composite material containing the identical piezoelectric particles 26 in a matrix containing a dielectric polymer material such as polyvinylidene fluoride, a vinylidene fluoride-tetrafluoroethylene copolymer, or a vinylidene fluoride-trifluoroethylene copolymer, a piezoelectric layer consisting of polyvinylidene fluoride, a piezoelectric layer consisting of a fluororesin other than polyvinylidene fluoride, and a piezoelectric layer obtained by laminating a film consisting of poly-L lactic acid and a film consisting of poly-D lactic acid can also be used.

However, as described above, from the viewpoints of exhibiting a behavior of being rigid with respect to a vibration of 20 Hz to 20 kHz and being flexible with respect to a vibration of less than or equal to a few Hz, obtaining excellent acoustic characteristics, and exhibiting excellent flexibility, the polymer-based piezoelectric composite material containing the piezoelectric particles 26 in the polymer matrix 24 consisting of a polymer material having a viscoelasticity at room temperature, such as cyanoethylated PVA is suitably used.

The laminated film of the piezoelectric film 10 illustrated in FIG. 1 has a configuration in which the second electrode layer 16 is provided on one surface of the piezoelectric layer 12, the second protective layer 20 is provided on the surface of the second electrode layer 16, the first electrode layer 14 is provided on the other surface of the piezoelectric layer 12, and the first protective layer 18 is provided on the surface of the first electrode layer 14. In the piezoelectric film 10, the first electrode layer 14 and the second electrode layer 16 form an electrode pair.

That is, the laminated film constituting the piezoelectric film 10 according to the embodiment of the present invention has a configuration in which both surfaces of the piezoelectric layer 12 are sandwiched between the electrode pair, that is, the first electrode layer 14 and the second electrode layer 16 and preferably between the first protective layer 18 and the second protective layer 20.

In this manner, the region where the both surfaces are sandwiched between the first electrode layer 14 and the second electrode layer 16 is driven according to the applied voltage.

In the present invention, the terms "first" and "second" in the first electrode layer 14 and the second electrode layer 16 are denoted for convenience to describe the piezoelectric film 10 according to the embodiment of the present invention.

Therefore, the terms "first" and "second" in the piezoelectric film 10 according to the embodiment of the present invention have no technical meaning and are irrelevant to the actual use state.

Further, the piezoelectric film 10 according to the embodiment of the present invention may further include a bonding layer for bonding the electrode layer and the piezoelectric layer 12 to each other and a bonding layer for bonding the electrode layer and the protective layer to each other, in addition to the above-described layers.

The bonding agent may be an adhesive or a pressure sensitive adhesive. Further, the same material as the polymer material obtained by removing the piezoelectric particles 26 from the piezoelectric layer 12, that is, the polymer matrix 24 can also be suitably used as the bonding agent. Further, the bonding layer may be provided on both the first electrode layer 14 side and the second electrode layer 16 side or may be provided only on one of the first electrode layer 14 side or the second electrode layer 16 side.

The first protective layer 18 and the second protective layer 20 in the piezoelectric film 10 have a function of coating the first electrode layer 14 and the second electrode layer 16 and applying moderate rigidity and mechanical strength to the piezoelectric layer 12. That is, in the piezoelectric film 10 according to the embodiment of the present invention, the piezoelectric layer 12 containing the polymer matrix 24 and the piezoelectric particles 26 exhibits extremely excellent flexibility under bending deformation at a slow vibration, but may have insufficient rigidity or mechanical strength depending on the applications. As a compensation for this, the piezoelectric film 10 is provided with the first protective layer 18 and the second protective layer 20.

The second protective layer 20 and the first protective layer 18 have an identical configuration except for the disposition position. Therefore, in the description below, in a case where it is not necessary to distinguish the second protective layer 20 from the first protective layer 18, both members are collectively referred to as a protective layer.

The protective layer is not limited, and various sheet-like materials can be used as the protective layer, and suitable examples thereof include various resin films. Among these, from the viewpoints of excellent mechanical characteristics and heat resistance, a resin film consisting of polyethylene terephthalate (PET), polypropylene (PP), polystyrene (PS), polycarbonate (PC), polyphenylene sulfide (PPS), polymethylmethacrylate (PMMA), polyetherimide (PEI), polyimide (PI), polyamide (PA), polyethylene naphthalate (PEN), triacetyl cellulose (TAC), and a cyclic olefin-based resin is suitably used.

The thickness of the protective layer is not limited. In addition, the thicknesses of the first protective layer 18 and the second protective layer 20 are basically the same as each other, but may be different from each other.

Here, in a case where the rigidity of the protective layer is extremely high, not only is the stretch and contraction of the piezoelectric layer 12 constrained, but also the flexibility is impaired. Therefore, it is advantageous that the thickness of the protective layer decrease except for the case where the mechanical strength or excellent handleability as a sheet-like material is required.

In a case where the thickness of the first protective layer 18 and the thickness of the second protective layer 20 are respectively two times or less the thickness of the piezoelectric layer 12, preferable results in terms of ensuring of the rigidity and achieving moderate elasticity can be obtained.

For example, in a case where the thickness of the piezoelectric layer 12 is 50 μm and the second protective layer 20 and the first protective layer 18 consist of PET, the thickness of the second protective layer 20 and the thickness of the first protective layer 18 are respectively preferably 100 μm or less, more preferably 50 μm or less, and still more preferably 25 μm or less.

In the piezoelectric film 10 (laminated film), the first electrode layer 14 is formed between the piezoelectric layer 12 and the first protective layer 18, and the second electrode layer 16 is formed between the piezoelectric layer 12 and the second protective layer 20. The first electrode layer 14 and the second electrode layer 16 are provided to apply an electric field to the piezoelectric film 10 (piezoelectric layer 12).

Here, as illustrated in FIG. 1, the first electrode layer 14 and the second electrode layer 16 partially have portions (a burr 14a and a burr 16a) protruding from the piezoelectric layer 12 (laminated film) in the plane direction. The details thereof will be described below.

The second electrode layer 16 and the first electrode layer 14 are basically the same as each other except that the positions are different from each other. Therefore, in the description below, in a case where it is not necessary to distinguish the second electrode layer 16 from the first electrode layer 14, both members are collectively referred to as an electrode layer.

In the piezoelectric film according to the embodiment of the present invention, the material for forming the electrode layer is not limited, and various conductors can be used as the material. Specific examples thereof include conductive polymers such as carbon, palladium, iron, tin, aluminum, nickel, platinum, gold, silver, copper, chromium, molybdenum, alloys thereof, indium tin oxide, and polyethylene dioxythiophene-polystyrene sulfonic acid (PEDOT/PSS).

Among these, copper, aluminum, gold, silver, platinum, and indium tin oxide are suitable. Among these, from the viewpoints of the conductivity, the cost, and the flexibility, copper is more preferable.

In addition, the method of forming the electrode layer is not limited, and various known methods, for example, a film forming method such as a vapor-phase deposition method (a vacuum film forming method) such as vacuum vapor deposition or sputtering, a film forming method of using plating, a method of bonding a foil formed of the materials described above, and a coating method can be used.

Among these, particularly from the viewpoint of ensuring the flexibility of the piezoelectric film 10, a thin film made of copper or aluminum formed by vacuum vapor deposition is suitably used as the electrode layer. Among these, particularly a thin film made of copper formed by vacuum vapor deposition is suitably used.

The thicknesses of the first electrode layer 14 and the second electrode layer 16 are not limited. In addition, the thicknesses of the first electrode layer 14 and the second electrode layer 16 are basically the same as each other, but may be different from each other.

Here, similarly to the protective layer described above, in a case where the rigidity of the electrode layer is extremely high, not only is the stretch and contraction of the piezoelectric layer 12 constrained, but also the flexibility is impaired. Therefore, it is advantageous that the thickness of the electrode layer decreases in a range where the electric resistance is not excessively high.

It is suitable that the product of the thickness of the electrode layer of the piezoelectric film 10 according to the embodiment of the present invention and the Young's modulus thereof is less than the product of the thickness of the protective layer and the Young's modulus thereof because the flexibility is not considerably impaired.

For example, in a case of a combination consisting of the protective layer formed of PET (Young's modulus: approximately 6.2 GPa) and the electrode layer formed of copper (Young's modulus: approximately 130 GPa), the thickness of the electrode layer is preferably 1.2 μm or less, more preferably 0.3 μm or less, and still more preferably 0.1 μm or less in a case of assuming that the thickness of the protective layer is 25 μm.

The piezoelectric film 10 has a configuration in which the piezoelectric layer 12 is sandwiched between the first electrode layer 14 and the second electrode layer 16 and further sandwiched between the first protective layer 18 and the second protective layer 20.

It is preferable that, in such a piezoelectric film 10, the maximal value at which the loss tangent (tan δ) at a frequency of 1 Hz according to dynamic viscoelasticity measurement is 0.1 or greater is present at room temperature.

In this manner, even in a case where the piezoelectric film 10 is subjected to bending deformation at a slow vibration of less than or equal to a few Hz from the outside, since the strain energy can be effectively diffused to the outside as heat, occurrence of cracks on the interface between the polymer matrix and the piezoelectric particles can be prevented.

In the piezoelectric film 10, it is preferable that the storage elastic modulus (E') at a frequency of 1 Hz according to the dynamic viscoelasticity measurement is 10 to 30 GPa at 0° C. and 1 to 10 GPa at 50° C.

In this manner, the piezoelectric film 10 may have large frequency dispersion in the storage elastic modulus (E') at room temperature. That is, the piezoelectric film 10 can exhibit a behavior of being rigid with respect to a vibration of 20 Hz to 20 kHz and being flexible with respect to a vibration of less than or equal to a few Hz.

In the piezoelectric film 10, it is preferable that the product of the thickness and the storage elastic modulus (E') at a frequency of 1 Hz according to the dynamic viscoelasticity measurement is in a range of $1.0 \times 10^6$ to $2.0 \times 10^6$ N/m at 0° C. and in a range of $1.0 \times 10^5$ to $1.0 \times 10^6$ N/m at 50° C.

In this manner, the piezoelectric film 10 may have moderate rigidity and mechanical strength within a range not impairing the flexibility and the acoustic characteristics.

Further, in the piezoelectric film 10, it is preferable that the loss tangent (Tan δ) at a frequency of 1 kHz at 25° C. is 0.05 or greater in a master curve obtained from the dynamic viscoelasticity measurement.

In this manner, the frequency of a speaker using the piezoelectric film 10 is smooth as the frequency characteristic thereof, and thus a change in acoustic quality in a case where the lowest resonance frequency $f_0$ is changed according to a change in the curvature of the speaker (piezoelectric film 10) can be decreased.

As illustrated in FIG. 1, the piezoelectric film 10 has a through-hole 18a formed such that the first protective layer 18 penetrates to the first electrode layer 14. The through-hole 18a is provided with a conductive first connection member 32 connected to the first electrode layer 14. Further, the first lead-out electrode 34 that is connected to the first connection member 32 and connects the piezoelectric film 10 to an external power supply is provided.

Similarly, the second protective layer 20 also has the identical through-hole 20a, and the through-hole 20a is provided with a conductive second connection member 33 that is connected to the second electrode layer 16. Similarly, the second lead-out electrode 36 that is connected to the second connection member 33 and connects the piezoelectric film 10 to an external power supply is provided.

Figure 10:
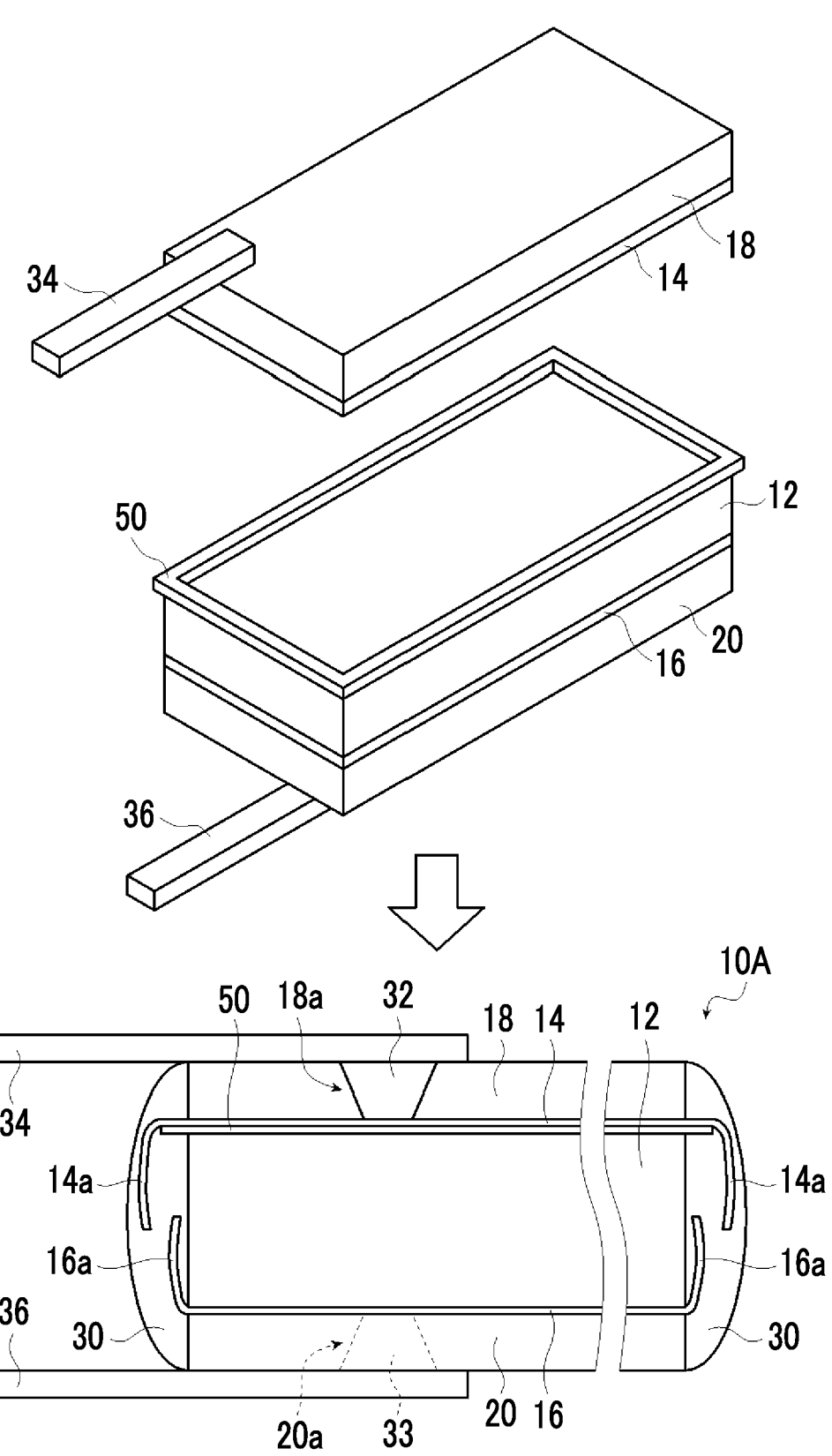
FIG. 10 is a view conceptually illustrating another example of the piezoelectric film according to the embodiment of the present invention.

The first lead-out electrode 34 and the second lead-out electrode 36 are provided at different positions in the plane direction of the piezoelectric film 10 (laminated film) (see FIG. 10 and the like). In FIG. 1, the first lead-out electrode 34 and the second lead-out electrode 36 are provided at different positions in a direction orthogonal to the paper surface in the figure.

In the example illustrated in the figure, the first lead-out electrode 34 and the second lead-out electrode 36 are led out in identical direction, but the present invention is not limited thereto, and various configurations can be used.

For example, the first lead-out electrode 34 and the second lead-out electrode 36 may be led out in opposite directions, or the first lead-out electrode 34 and the second lead-out electrode 36 may be led out so as to be orthogonal to each other.

Since the method of leading out the electrode in the first electrode layer 14 and the method of leading out the electrode in the second electrode layer 16 are the same as each other, the following description will be made using the first electrode layer 14 as an example.

The through-hole 18a (through-hole 20a) is a through-hole punched to the first protective layer 18 (second protective layer 20) to form the first connection member 32 that connects the first electrode layer 14 and the first lead-out electrode 34.

The size of the through-hole 18a is not limited, and the size that enables formation of the first connection member 32 capable of obtaining sufficient conduction may be appropriately set according to the material for forming the first electrode layer 14 and the first lead-out electrode 34, the size of the first lead-out electrode 34, the size of the piezoelectric film 10, and the like.

The shape of the through-hole 18a is not limited. Therefore, various shapes such as a truncated cone shape, a cylindrical shape, and a square tubular shape can be used as the shape of the through-hole.

As a method of forming the through-hole 18a, various known methods can be used depending on the material for forming the first protective layer 18.

Examples thereof include a method of removing the first protective layer 18 by burning (ablation) the layer with a laser beam such as a laser beam having a wavelength of 10.6 μm by a carbon dioxide laser to form the through-hole 18a. For example, the through-hole 18a may be formed at a desired position of the first protective layer 18 by scanning the formation position of the through-hole 18a in the first protective layer 18 with a laser beam. In this case, the through-hole 18a having a desired thickness can be formed by adjusting the intensity, the scanning speed, and the like of the laser beam. The adjustment of the scanning speed is adjustment of the treatment time using the laser beam.

Further, a method of forming the through-hole 18a by dissolving the first protective layer 18 with an organic solvent can also be used. For example, in a case where the first protective layer 18 is formed of PET, the through-hole 18a can be formed by using hexafluoroisopropanol or the like. In a case where a solvent is used, the through-hole 18a may be formed at a desired position by using a mask or the like in the same manner as etching in photolithography or the like. In this case, the through-hole 18a having a desired thickness can be formed by adjusting the treatment time, the concentration of the organic solvent, and the like.

The through-hole 18a is provided with the first connection member 32 (second connection member 33). The first connection member 32 electrically connects the first electrode layer 14 and the first lead-out electrode 34.

In the piezoelectric film 10 according to the embodiment of the present invention, various kinds consisting of conductive materials that can be inserted into the through-hole 18a can be used as the first connection member 32.

Specific examples thereof include a metal paste obtained by dispersing metal particles such as silver, copper, and gold in a binder consisting of a thermosetting resin such as an epoxy resin or polyimide, a metal paste obtained by dispersing the same metal particles as described above in a binder consisting of a resin cured at room temperature, such as an acrylic resin, a metal paste thermally cured by a metal simple substance due to a complex metal, metal tape such as copper foil tape, and a metal member that can be inserted into the through-hole 18a.

The first lead-out electrode 34 (second lead-out electrode 36) is a wiring that is electrically connected to the first connection member 32 and is used for electrically connecting an external power supply and the piezoelectric film 10 to each other. Therefore, the first lead-out electrode 34 extends to the outside of the laminated film obtained by laminating the piezoelectric layer 12, the electrode layers, and the protective layers, in the plane direction.

The first lead-out electrode 34 is not limited, and various known kinds used as a wiring that electrically conducts an electrode or the like, a power supply, and an external device, for example, metal foil such as copper foil and various metal wirings can be used.

Further, the length of the first lead-out electrode 34 outside the laminated film in the plane direction may be appropriately set according to the application of the piezoelectric film 10, the device to which the piezoelectric film 10 is connected, the installation position of the piezoelectric film 10, and the like.

Further, the first lead-out electrode 34 and the first connection member 32 may be bonded to each other as necessary. The first lead-out electrode 34 and the first connection member 32 may be bonded to each other by a known method.

Examples of the known method include a method of using a conductive bonding agent (such as an adhesive or a pressure sensitive adhesive) and a method of using conductive double-sided tape. Further, a method of bonding the first lead-out electrode 34 and the first connection member 32 to each other by using a metal paste such as a silver paste for the first connection member 32 and using copper foil, a conductive wire, and the like for the first lead-out electrode 34 so that the first lead-out electrode 34 and the first connection member 32 have adhesiveness can also be used.

In the piezoelectric film 10 illustrated in FIG. 1, the electrode for connection to an external power supply is led out by forming a through-hole in the protective layer, providing an electrode connection member in the through-hole, and connecting the electrode connection member and the lead-out electrode to each other, as a preferred embodiment in which the end surface coating layer 30 described below is easily formed on the entire end surface of the laminated film.

However, the piezoelectric film according to the embodiment of the present invention is not limited thereto, and various configurations can be used for leading the electrode out.

For example, a wiring for leading out, such as a rod-like or sheet-like (film-like or plate-like) wiring is provided between the protective layer and the piezoelectric layer or between the electrode layer and the protective layer, and a lead-out electrode may be connected to the wiring for leading out. Alternatively, the wiring for leading out may be used as it is as a lead-out electrode. Alternatively, a part of the protective layer and the electrode layer may be allowed to protrude from the piezoelectric layer in the plane direction, the protruding electrode layer is used as a wiring for leading out, and a lead-out electrode may be connected to the wiring.

The piezoelectric film 10 according to the embodiment of the present invention has a configuration in which the entire end surface of the laminated film consisting of the piezoelectric layer 12, the first electrode layer 14 and the second electrode layer 16 provided on both surfaces of the piezoelectric layer 12, and the first protective layer 18 and the second protective layer 20 formed on the surfaces of the electrode layers is covered with the insulating end surface coating layer 30.

The material for forming the end surface coating layer 30 is not limited, and various known materials that have insulating properties and have sufficient heat resistance to a short circuit between the first electrode layer 14 and the second electrode layer 16 for removing burrs described below can be used.

Example of the known materials include polyimide and polyethylene terephthalate having heat resistance.

The thickness of the end surface coating layer 30 is also not limited, and the thickness set such that burrs (the burr 14a and the burr 16a) of the first electrode layer 14 and the second electrode layer 16 described below are sufficiently embedded and blocked from air may be appropriately set.

The method of forming the end surface coating layer 30 on the end surface of the laminated film is not limited, and a known forming method (film forming method) according to the forming material of the end surface coating layer 30 can be used.

Examples of the known method include a method of bonding insulating pressure sensitive adhesive tape, a method of applying and drying a liquid in which a material forming the end surface coating layer 30 is dissolved, a method of applying and curing a liquid obtained by heating and melting a material forming the end surface coating layer 30, and a method of dissolving a resin forming the end surface coating layer 30 in a solvent and coating and drying the mixture. Examples of the insulating pressure sensitive adhesive tape include pressure sensitive adhesive tape consisting of polyimide, polyethylene terephthalate, and the like.

The method of applying a liquid in this case is not limited, and various known methods can be used. Examples of the known methods include spray coating and dip coating.

Further, the end surface coating layer 30 may be formed up to the main surface of the first protective layer 18 and/or the second protective layer 20 as necessary. For example, the end surface coating layer 30 may be formed by attaching polyimide single-sided tape from the main surfaces of the first protective layer 18 and the second protective layer 20 so as to wrap the end surfaces. The main surface is the maximum surface of a sheet-like material (a layer, a film, or a plate-like material).

Further, in a case where the piezoelectric film 10 according to the embodiment of the present invention is a laminate of the piezoelectric film 10 as described below, the laminate of the piezoelectric film 10 is formed, and the end surface coating layer 30 may be similarly formed on the end surface of the laminated film.

In the piezoelectric film 10 according to the embodiment of the present invention, the water vapor permeability of the end surface coating layer 30 may be set to 100 g/(m²·day) or less so that the end surface coating layer 30 has gas barrier properties. The piezoelectric film 10 has such an end surface coating layer 30, and thus deterioration of the piezoelectric layer 12 can be prevented even in a case where components constituting the piezoelectric layer 12 are deteriorated due to moisture.

Further, in the piezoelectric film 10 according to the embodiment of the present invention, the end surface coating layer 30 is made to have a certain degree of hardness by allowing the end surface coating layer 30 to function as the protective layer of the piezoelectric layer 12, the first electrode layer 14, and the second electrode layer 16, as necessary.

Since the piezoelectric film 10 according to the embodiment of the present invention has a configuration in which the end surface of the laminated film obtained by laminating the electrode layers and the protective layers on both surfaces of the piezoelectric layer 12 is coated with the end surface coating layer 30, a short circuit between the 14 and the second electrode layer 16 is prevented.

As described above, the first electrode layer 14 and the second electrode layer 16 in the piezoelectric film 10 are extremely thin. Therefore, as described below, the piezoelectric film 10 (laminated film) is prepared by forming the piezoelectric layer 12 on a laminate of the protective layers and the electrode layers and laminating an identical laminate on the piezoelectric layer.

Here, in order to prepare the piezoelectric film 10 having a desired shape with a desired size, it is necessary to cut (punch) the laminate of the protective layers and the electrode layers into a cut sheet having a target shape. In a case of such cutting, the electrode layers are led out due to the ductility of the metal and protrude from the protective layers, and thus so-called burrs are generated.

The orientation of the burr of the electrode layer is unknown in many cases during the preparation of the piezoelectric film 10.

Therefore, in the laminated first electrode layer 14 and second electrode layer 16, the burr 14a and the burr 16a protruding from the laminated film may be bent in directions in which the burr 14a and the burr 16a are close to each other or face each other.

As described above, the piezoelectric layer 12 is extremely thin. As a result, the burr 14a and the burr 16a that face each other come into contact with each other, the first electrode layer 14 and the second electrode layer 16 are short-circuited, and thus the piezoelectric film does not operate properly (see FIG. 9).

Meanwhile, in a case of so-called roll-to-roll production or production using a cut sheet larger than the target shape, the laminated film obtained by laminating the electrode layers and the protective layers on both surfaces of the piezoelectric layer is prepared, and the laminated film is cut into a desired shape to form a cut sheet.

Here, the directions in which the burr 14a of the first electrode layer 14 and the burr 16a of the second electrode layer 16 are bent are the same as each other. Therefore, the burrs do not face each other in the first electrode layer 14 and the second electrode layer 16, and a short circuit is unlikely to occur as compared with the above-described case.

However, as described above, the piezoelectric layer 12 has a thickness of approximately 8 to 300 μm, which is extremely thin. Therefore, the burr 14a of the first electrode layer 14 and the burr 16a of the second electrode layer 16 come into contact with each other and cause a short circuit in some cases.

Even in this case, for example, the orientation of the burr is changed by receiving an external force or the like during formation of the through-hole 18a or the like, and the burr 14a of the first electrode layer 14 and the burr 16a of the second electrode layer 16 are bent and face each other in directions in which the burr 14a and the burr 16a are close to each other, and come into contact with each other in some cases.

Meanwhile, the piezoelectric film 10 according to the embodiment of the present invention has the insulating end surface coating layer 30 on the end surface of the laminated film obtained by laminating the electrode layers and the protective layers on both surfaces of the piezoelectric layer 12.

Since the piezoelectric film 10 according to the embodiment of the present invention has such an end surface coating layer 30, the contact between the burr 14a of the first electrode layer 14 and the burr 16a of the second electrode layer 16 is eliminated by short-circuiting the first electrode layer 14 and the second electrode layer 16 in advance during the production so that a short circuit between the first electrode layer 14 and the second electrode layer 16 in the prepared piezoelectric film 10 is prevented.

Hereinafter, the end surface coating layer 30 will be described in detail with reference to FIGS. 3 to 9 which conceptually illustrate an example of the method of producing the piezoelectric film according to the embodiment of the present invention.

Figure 3:
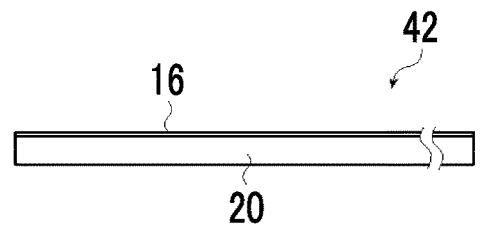
FIG. 3 is a conceptual view for describing a method of producing the piezoelectric film illustrated in FIG. 1.

First, as illustrated in FIG. 3, a second laminate 42 having the second electrode layer 16 formed on the surface of the second protective layer 20 is prepared.

Figure 5:
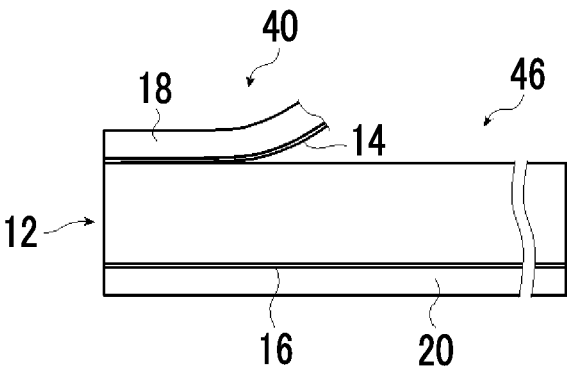
FIG. 5 is a conceptual view for describing the method of producing the piezoelectric film illustrated in FIG. 1.

Further, a first laminate 40 having the first electrode layer 14 formed on the surface of the first protective layer 18, which is conceptually illustrated in FIG. 5, is prepared.

The second laminate 42 may be prepared by forming a copper thin film or the like as the second electrode layer 16 on the surface of the second protective layer 20 using vacuum vapor deposition, sputtering, plating, or the like. Similarly, the first laminate 40 may be prepared by forming a copper thin film or the like as the first electrode layer 14 on the surface of the first protective layer 18 using vacuum vapor deposition, sputtering, plating, or the like.

Alternatively, a commercially available sheet-like material in which a copper thin film or the like is formed on a protective layer may be used as the second laminate 42 and/or the first laminate 40.

The second laminate 42 and the first laminate 40 may be the same as or different from each other.

In a case where the protective layer is extremely thin and thus the handleability is degraded, a protective layer with a separator (temporary support) may be used as necessary. Further, a PET having a thickness of 25 μm to 100 μm or the like can be used as the separator. The separator may be removed after thermal compression bonding of the electrode layer and the protective layer.

Figure 4:
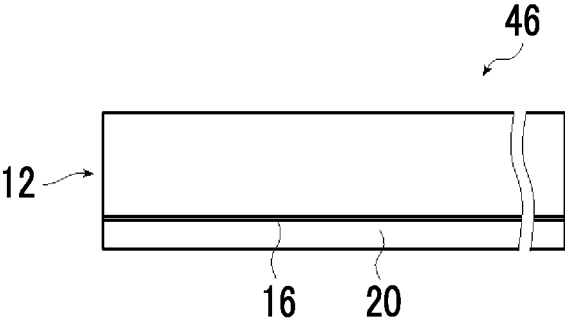
FIG. 4 is a conceptual view for describing the method of producing the piezoelectric film illustrated in FIG. 1.

Next, as illustrated in FIG. 4, a piezoelectric laminate 46 obtained by laminating the second laminate 42 and the piezoelectric layer 12 is prepared by forming the piezoelectric layer 12 on the second electrode layer 16 of the second laminate 42 (piezoelectric layer formation step).

The piezoelectric layer 12 may be formed by a known method.

For example, the piezoelectric layer in which the piezoelectric particles 26 are dispersed in the polymer matrix 24 illustrated in FIG. 2 is prepared in the following manner, as an example.

First, a coating material is prepared by dissolving the polymer material such as cyanoethylated PVA in an organic solvent, adding the piezoelectric particles 26 such as PZT particles thereto, and stirring the solution. The organic solvent is not limited, and various organic solvents such as dimethylformamide (DMF), methyl ethyl ketone, and cyclohexanone can be used.

In a case where the second laminate 42 is prepared and the coating material is prepared, the coating material is cast (applied) to the second laminate 42, and the organic solvent is evaporated and dried. In this manner, as illustrated in FIG. 4, the piezoelectric laminate 46 in which the second electrode layer 16 is provided on the second protective layer 20 and the piezoelectric layer 12 is laminated on the second electrode layer 16 is prepared.

A casting method for the coating material is not limited, and all known methods (coating devices) such as a bar coater, a slide coater, and a doctor knife can be used.

Figure 7:
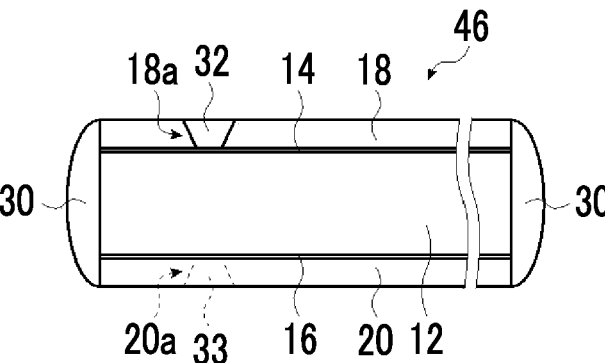
FIG. 7 is a conceptual view for describing the method of producing the piezoelectric film illustrated in FIG. 1.
Figure 8:
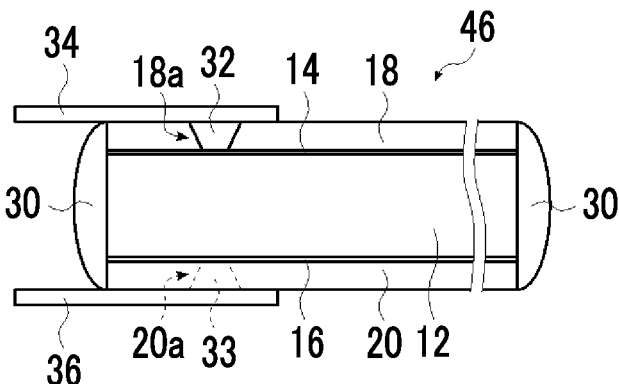
FIG. 8 is a conceptual view for describing the method of producing the piezoelectric film illustrated in FIG. 1.

Alternatively, in a case where the polymer material is a material that can be heated and melted, the piezoelectric laminate 46 as illustrated in FIG. 8 may be prepared by heating and melting the polymer material to prepare a melt obtained by adding the piezoelectric particles 26 to the melted material, extruding the melt on the second laminate 42 illustrated in FIG. 7 in a sheet shape by carrying out extrusion molding or the like, and cooling the laminate.

As described above, in the piezoelectric film 10, a polymer piezoelectric material such as PVDF may be added to the polymer matrix 24 in addition to the polymer material having a viscoelasticity at room temperature.

In a case where the polymer piezoelectric material is added to the polymer matrix 24, the polymer piezoelectric material to be added to the coating material may be dissolved. Alternatively, the polymer piezoelectric material to be added may be added to the heated and melted polymer material having a viscoelasticity at room temperature so that the polymer piezoelectric material is heated and melted.

A calender treatment may be performed after formation of the piezoelectric layer 12, as necessary. The calender treatment may be performed once or a plurality of times.

As is well known, the calender treatment is a treatment in which the surface to be treated is pressed while being heated by a heating press, a heating roller, or the like to flatten the surface.

Further, the piezoelectric layer 12 of the piezoelectric laminate 46 in which the second electrode layer 16 is provided on the second protective layer 20 and the piezoelectric layer 12 is formed on the second electrode layer 16 is subjected to the polarization treatment (poling).

The method of performing a polarization treatment on the piezoelectric layer 12 is not limited, and a known method can be used. For example, electric field poling in which a DC electric field is directly applied to a target to be subjected to the polarization treatment is exemplified. Further, in a case of performing electric field poling, the electric filed poling treatment may be performed using the first electrode layer 14 and the second electrode layer 16 by forming the first electrode layer 14 before the polarization treatment.

Further, in a case where the piezoelectric film 10 according to the embodiment of the present invention is produced, the polarization treatment is performed in the thickness direction of the piezoelectric layer 12 instead of the plane direction.

Next, as illustrated in FIG. 5, the first laminate 40 that has been prepared in advance is laminated on the piezoelectric layer 12 side of the laminate 46 that has been subjected to the polarization treatment such that the first electrode layer 14 is directed toward the piezoelectric layer 12 (lamination step).

Further, the laminate is subjected to thermal compression bonding using a heating press device, a heating roller, or the like such that the second protective layer 20 and the first protective layer 18 are sandwiched, and the piezoelectric laminate 46 and the first laminate 40 are bonded to each other.

In this manner, the laminated film consisting of the piezoelectric layer 12, the first electrode layer 14 and the second electrode layer 16 provided on both surfaces of the piezoelectric layer 12, and the first protective layer 18 and the second protective layer 20 formed on the surfaces of the electrode layers is produced (film preparation step).

The piezoelectric film 10 according to the embodiment of the present invention to be prepared by performing the above-described preparation step may be polarized in the thickness direction instead of the plane direction, and thus excellent piezoelectric characteristics can be obtained even in a case where the stretching treatment is not performed after the polarization treatment. Therefore, the piezoelectric film 10 according to the embodiment of the present invention has no in-plane anisotropy as a piezoelectric characteristic, and stretches and contracts isotropically in all directions in the plane direction in a case where a driving voltage is applied.

Figure 6:
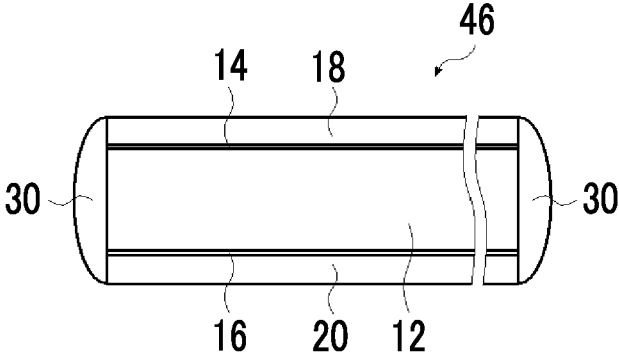
FIG. 6 is a conceptual view for describing the method of producing the piezoelectric film illustrated in FIG. 1.

Next, as illustrated in FIG. 6, the end surface coating layer 30 is formed on the entire end surface of the laminated film (coating layer formation step). Further, the laminated film may be cut into a desired shape before the formation of the end surface coating layer 30 as necessary.

Next, as illustrated in FIG. 7, the through-hole 18a is formed in the first protective layer 18, and the through-hole 20a is formed in the second protective layer 20 (through-hole formation step).

Next, as illustrated in FIG. 8, the first connection member 32 is formed in the through-hole 18a to connect the first lead-out electrode 34 to the piezoelectric film, and the second connection member 33 is formed in the through-hole 20a to connect the second lead-out electrode 36 to the piezoelectric film (the connection member formation step and the electrode formation step).

Further, the method of forming the end surface coating layer 30, the through-hole 18a and the through-hole 20a, the first connection member 32 and the second connection member 33, and the first lead-out electrode 34 and the second lead-out electrode 36 is as described above.

After the formation of the first lead-out electrode 34 and the second lead-out electrode 36, the first lead-out electrode 34 and the second lead-out electrode 36 are connected to a power supply to energize the first electrode layer 14 and the second electrode layer 16 (energization step).

By carrying out the energization, the contact between the burr 14a of the first electrode layer 14 and the burr 16a of the second electrode layer 16 is eliminated, and thus a short circuit between the first electrode layer 14 and the second electrode layer 16 in the prepared piezoelectric film 10 is prevented.

Figure 9:
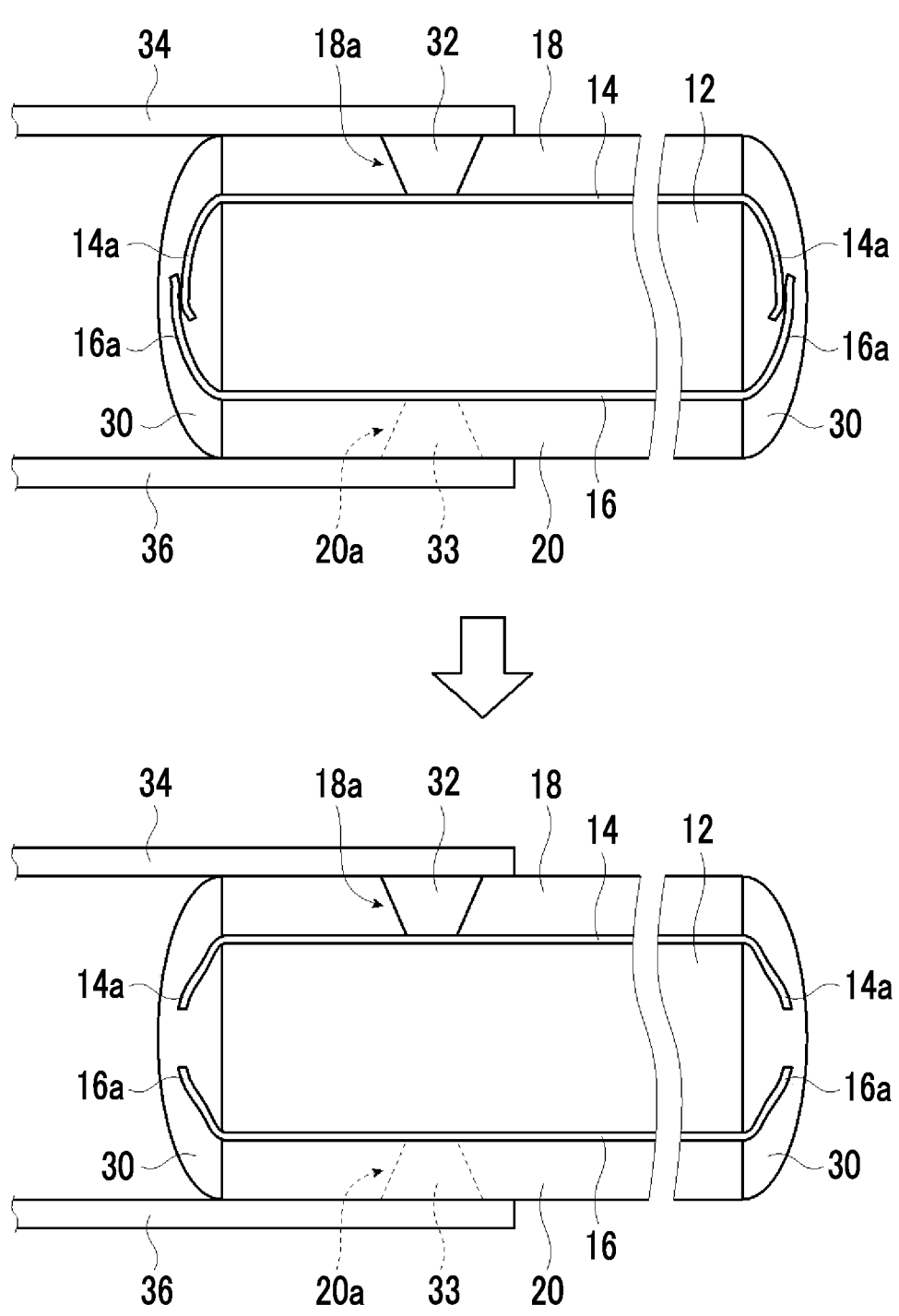
FIG. 9 is a conceptual view for describing the method of producing the piezoelectric film illustrated in FIG. 1.

As described above, there is a possibility that the burr 14a of the first electrode layer 14 and the burr 16a of the second electrode layer 16 are in contact with each other on the end surface of the laminated film, as illustrated in the upper part of FIG. 9. In FIGS. 1 to 8, the burr 14a of the first electrode layer 14 and the burr 16a of the second electrode layer 16 are not illustrated.

In a case where the burr 14a of the first electrode layer 14 and the burr 16a of the second electrode layer 16 are energized in a state of being in contact with each other, the first electrode layer 14 and the second electrode layer 16 are short-circuited. Here, the end surface of the laminated film is coated with the end surface coating layer 30. That is, the burr 14a of the first electrode layer 14 and the burr 16a of the second electrode layer 16 are not in contact with air. Further, the first electrode layer 14 and the second electrode layer 16 are extremely thin.

Therefore, the contact portion between the burr 14a of the first electrode layer 14 and the burr 16a of the second electrode layer 16 is burned up due to the short circuit, enters a so-called flying state, and is eliminated. As a result, as illustrated in the lower part (FIG. 1) of FIG. 9, the burr 14a of the first electrode layer 14 and the burr 16a of the second electrode layer 16 are completely separated from each other. Further, at least the tip portions of the burr 14a of the first electrode layer 14 and the burr 16a of the second electrode layer 16 that remain after the burning up due to the short circuit is turned into burned black.

Therefore, the piezoelectric film 10 according to the embodiment of the present invention can suitably prevent a short circuit caused by the burr 14a of the first electrode layer 14 and the burr 16a of the second electrode layer 16.

The electric power for energization to short-circuit the first electrode layer 14 and the second electrode layer 16 using the burrs is not limited.

It is preferable that the first electrode layer 14 and the second electrode layer 16 are short-circuited by applying a voltage higher than the voltage applied to operate the assumed steady piezoelectric film 10. For example, in a case where the operating voltage of the steady piezoelectric film 10 is 50 V, the voltage for short-circuiting the first electrode layer 14 and the second electrode layer 16 in the energization step is preferably 150 to 200 V.

In the example illustrated in FIG. 1, the end surface coating layer 30 is formed on the entire end surface of the laminated film obtained by laminating the electrode layers and the protective layers on both surfaces of the piezoelectric layer 12, as a preferred embodiment.

However, the present invention is not limited thereto. For example, the end surface coating layer 30 is formed only on the end surface that needs to be prevented from a short circuit by confirming in advance the end surface having burrs that may cause a short circuit during the preparation of the laminated film.

Here, from the viewpoint of more reliably preventing a short circuit between the first electrode layer 14 and the second electrode layer 16 caused by the burrs, it is preferable that the end surface coating layer 30 is formed on the entire end surface of the laminated film.

In the piezoelectric film according to the embodiment of the present invention, an interlayer insulation member may be provided on the end portion in the plane direction between the piezoelectric layer 12 and the first electrode layer 14 and/or between the piezoelectric layer 12 and the second electrode layer 16.

The piezoelectric film according to the embodiment of the present invention has the end surface coating layer 30 on the end surface of the laminated film and thus can suitably prevent a short circuit between the first electrode layer 14 and the second electrode layer 16 caused by the burr 14a of the first electrode layer 14 and the burr 16a of the second electrode layer 16. In addition to this, the piezoelectric film has the interlayer insulation member and thus can prevent a short circuit between the first electrode layer 14 and the second electrode layer 16 caused by the burrs of the electrode layers.

FIG. 10 illustrates an example thereof. In the example described below, the same members as those of the piezoelectric film 10 illustrated in FIG. 1 and the like are frequently used. Therefore, in the description below, the same members are denoted by the same reference numerals, and the description will be mainly made on different parts.

The piezoelectric film 10A illustrated in FIG. 10 has a rectangular frame-like interlayer insulation member 50 corresponding to the entire end portion of the piezoelectric layer 12 in the vicinity of the end portion between the first electrode layer 14 and the piezoelectric layer 12.

Since the piezoelectric film 10A has such an interlayer insulation member 50, the burr 14a of the first electrode layer 14 is repelled to prevent movement of the burr 14a toward the second electrode layer 16 side, and thus a short circuit between the first electrode layer 14 and the second electrode layer 16, caused by the burr 14a of the first electrode layer 14 and the burr 16a of the second electrode layer 16 can be more suitably prevented.

Further, the position of the end portion of the interlayer insulation member 50 in the plane direction may coincide with the end portion of the piezoelectric layer 12 (first electrode layer 14).

However, it is preferable that at least a part of the interlayer insulation member 50 protrudes from the piezoelectric layer 12 in the plane direction. The interlayer insulation member 50 may partially protrude, but it is preferable that the entire region of the interlayer insulation member 50 protrudes from the end portion of the piezoelectric layer 12, as illustrated in FIG. 10.

In this regard, the same applies to an interlayer insulation member 52 illustrated in FIG. 11, which will be described below.

The thickness of the interlayer insulation member 50 is not limited. The thickness of the interlayer insulation member 50 may be appropriately set such that the contact between the burrs can be impaired without interfering the contact between the piezoelectric layer 12 and the first electrode layer 14. The thickness of the interlayer insulation member 50 is preferably in a range of 5 to 30 μm and more preferably in a range of 5 to 15 μm.

The width of the interlayer insulation member 50 in the plane direction is not limited. Similarly, the width of the interlayer insulation member 50 in the plane direction may be appropriately set such that the contact between the burrs can be impaired without interfering the contact between the piezoelectric layer 12 and the first electrode layer 14. The width of the interlayer insulation member 50 in the plane direction is preferably in a range of 0.2 to 10 mm and more preferably in a range of 0.5 to 5 mm. Here, the width thereof in the plane direction is the width of the piezoelectric layer 12 in the in-plane direction and does not include the width of the protrusion from the piezoelectric layer 12.

As described above, it is preferable that the interlayer insulation member 50 protrudes from the end portion of the piezoelectric layer 12. The amount of protrusion of the interlayer insulation member 50 from the end portion of the piezoelectric layer 12 is not limited, and the effect of preventing the contact between the burrs due to the interlayer insulation members 50 can be improved in a case where even a small amount of the interlayer insulation member 50 protrudes from the end portion of the piezoelectric layer 12. The amount of protrusion of the interlayer insulation member 50 from the end portion of the piezoelectric layer 12 is preferably in a range of 0.05 to 5 mm and more preferably in a range of 0.1 to 2 mm.

Figure 11:
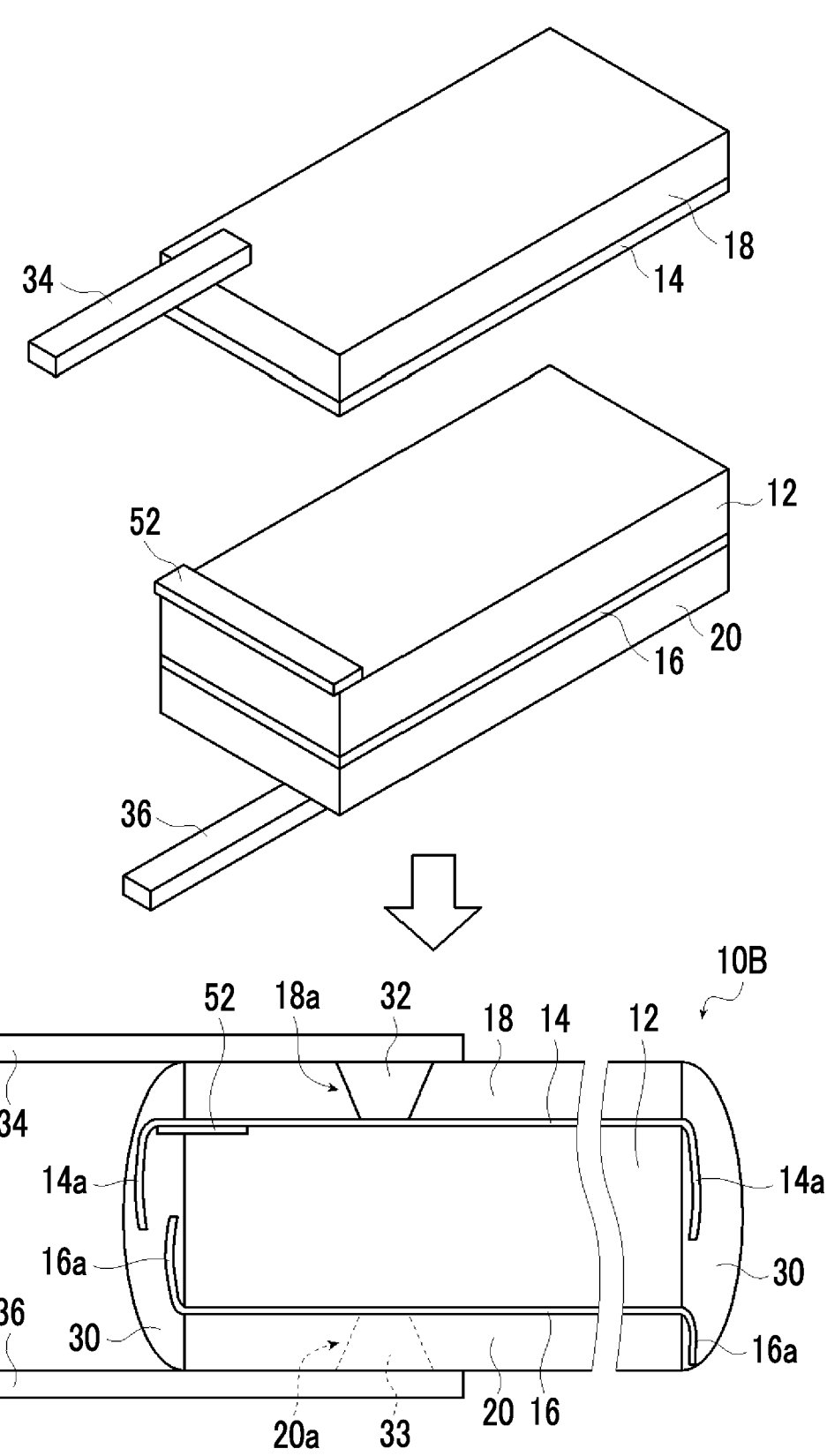
FIG. 11 is a view conceptually illustrating still another example of the piezoelectric film according to the embodiment of the present invention.

In this regard, the same applies to the interlayer insulation member 52 of a piezoelectric film 10B illustrated in FIG. 11.

In the example illustrated in FIG. 10, the piezoelectric layer 12 and the first electrode layer 14 are laminated by providing the interlayer insulation member 50 on the piezoelectric layer 12 side, but the present invention is not limited thereto. That is, in the present invention, the piezoelectric layer 12 and the first electrode layer 14 may be laminated by providing the interlayer insulation member 50 on the first electrode layer 14 side.

Further, in the example illustrated in FIG. 10, the interlayer insulation member 50 is provided between the piezoelectric layer 12 and the first electrode layer 14, but the present invention is not limited thereto. For example, the interlayer insulation member 50 may be provided between the piezoelectric layer 12 and the second electrode layer 16 or provided both between the piezoelectric layer 12 and the first electrode layer 14 and between the piezoelectric layer 12 and the second electrode layer 16. From the viewpoint of more suitably preventing a short circuit caused by the burrs, it is preferable that the interlayer insulation member 50 is provided both between the piezoelectric layer 12 and the first electrode layer 14 and between the piezoelectric layer 12 and the second electrode layer 16.

In this regard, the same applies to the interlayer insulation member 52 of the piezoelectric film 10B illustrated in FIG. 11.

FIG. 11 conceptually illustrates another example of the piezoelectric film having an interlayer insulation member.

In the piezoelectric film 10B illustrated in FIG. 11, the interlayer insulation member 52 is provided only on an end portion on a side where the first lead-out electrode 34 and the second lead-out electrode 36 are formed. That is, in this example, the interlayer insulation member 52 is provided on an end portion on a side where the electrode is led out from the piezoelectric film (laminated film).

As described above, in a case where the laminated film obtained by laminating the electrode layers and the protective layers on both surfaces of the piezoelectric layer 12 is prepared and cut into a predetermined shape, the direction in which the burr 14a of the first electrode layer 14 is bent and the direction in which the burr 16a of the second electrode layer 16 coincide with each other.

However, vibration, an external force, bending, and the like from the outside are applied to the side where the electrode is led out, that is, the side where the first lead-out electrode 34 and the second lead-out electrode 36 are formed, during various processing steps of punching the through-hole 18a and the through-hole 20a, forming the first connection member 32 and the second connection member 33, forming the first lead-out electrode 34 and the second lead-out electrode 36, and the like. As a result, the burr 14a of the first electrode layer 14 and the burr 16a of the second electrode layer 16 are bent in directions in which the burr 14a and the burr 16a are close to each other and come into contact with each other only on the side where the first lead-out electrode 34 and the second lead-out electrode 36 are formed, as illustrated in the upper part of FIG. 9.

Even in this case, for example, as shown in the example of the figure, the direction in which the burr 14a of the first electrode layer 14 is bent is controlled by providing the interlayer insulation member 52 on the end portion on the side where the first lead-out electrode 34 and the second lead-out electrode 36 are formed, between the first electrode layer 14 and the piezoelectric layer 12, and thus the contact between the burr 14a of the first electrode layer 14 and the burr 16a of the second electrode layer 16 can be prevented.

It is preferable that the interlayer insulation member 52 protrudes from the end portion of the piezoelectric layer 12, similarly to the case of the above-described interlayer insulation member 50 illustrated in FIG. 10.

Figure 12:
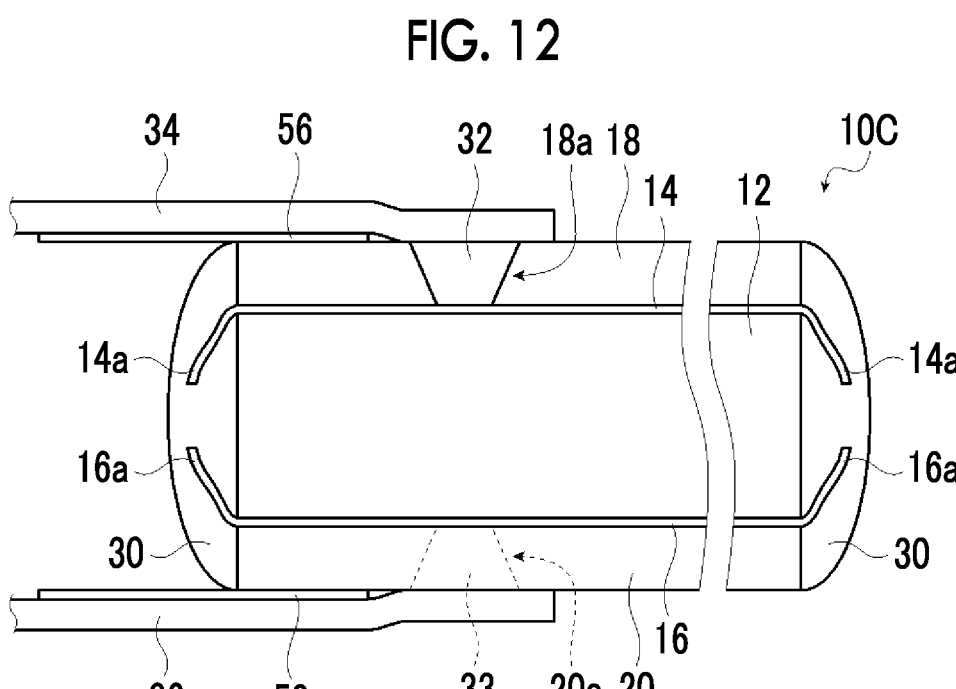
FIG. 12 is a cross-sectional view conceptually illustrating still another example of the piezoelectric film according to the embodiment of the present invention.

FIG. 12 conceptually illustrates another example of the piezoelectric film according to the embodiment of the present invention.

The piezoelectric film 10C illustrated in FIG. 12 has a first electrode insulation member 56 between the first lead-out electrode 34 and the first protective layer 18 and has a second electrode insulation member 58 between the second lead-out electrode 36 and the second protective layer 20.

Both the first electrode insulation member 56 and the second electrode insulation member 58 are insulation members which are provided between the lead-out electrode and the protective layer (laminated film) and protrude from the end portion of the protective layer.

The first lead-out electrode 34 and the second lead-out electrode 36 have flexibility in many cases.

In this case, the lead-out electrode positioned on the upper side in the vertical direction may hang down and come into contact with the burr of the electrode layer on the other side. For example, in a case where the first lead-out electrode 34 is on the upper side, the first lead-out electrode 34 may hang down and come into contact with the burr 16a or the like of the second electrode layer 16. In addition, the lead-out electrode may be bent and come into contact with the burr of the electrode layer on the other side.

On the contrary, in a case where the piezoelectric film includes the first electrode insulation member 56 and the second electrode insulation member 58, the electrode insulation member comes into contact with the burr of the electrode layer even in a case where any one of the lead-out electrodes hangs down and is bent, and thus a short circuit does not occur.

The thicknesses of the first electrode insulation member 56 and the second electrode insulation member 58 are not limited. That is, the thickness of the first electrode insulation member 56 and the thickness of the second electrode insulation member 58 may be appropriately set according to the formation material such that insulating properties can be sufficiently obtained.

The thickness of the first electrode insulation member 56 and the thickness of the second electrode insulation member 58 are each preferably in a range of 0.01 to 1 mm and more preferably in a range of 0.02 to 0.1 mm.

The thickness of the first electrode insulation member 56 and the thickness of the second electrode insulation member 58 may be the same as or different from each other.

The amount of protrusion of the first electrode insulation member 56 and the second electrode insulation member 58 from the laminated film (protective layer) is also not limited. That is, the amount of protrusion of the first electrode insulation member 56 and the second electrode insulation member 58 from the laminated film may be appropriately set according to the thickness and the like of the piezoelectric layer 12 such that the contact between the lead-out electrode and the burr of the electrode layer on the other side and the contact between the lead-out electrode and the lead-out electrode on the other side can be prevented.

The amount of protrusion of the first electrode insulation member 56 and the second electrode insulation member 58 from the laminated film is preferably in a range of 0.01 to 10 mm and more preferably in a range of 0.05 to 5 mm.

The amount of protrusion of the first electrode insulation member 56 and the second electrode insulation member 58 from the laminated film may be the same as or different from each other.

As a preferred embodiment, the piezoelectric film 10C illustrated in FIG. 12 has both the first electrode insulation member 56 corresponding to the first lead-out electrode 34 and the second electrode insulation member 58 corresponding to the second lead-out electrode 36, but the present invention is not limited thereto.

That is, the piezoelectric film according to the embodiment of the present invention may have any one of the first electrode insulation member 56 corresponding to the first lead-out electrode 34 or the second electrode insulation member 58 corresponding to the second lead-out electrode 36.

As the materials for forming the interlayer insulation member and the electrode insulation member described above are not limited, and various materials used for known insulation members used to perform electrical insulation can be used. As an example, the materials exemplified in the section of the end surface coating layer 30 can be used.

Further, the interlayer insulation member and the electrode insulation member may be formed by a known method according to the forming material to be used.

Further, in a case where the piezoelectric film has the above-described interlayer insulation members, the contact between the burr 14a of the first electrode layer 14 and the burr 16a of the second electrode layer 16 can be prevented even without providing the end surface coating layer 30. Further, in the case where the piezoelectric film has the above-described interlayer insulation members, the contact between the lead-out electrode and the burr of the electrode layer on the other side can be prevented even without providing the end surface coating layer 30.

Figure 13:
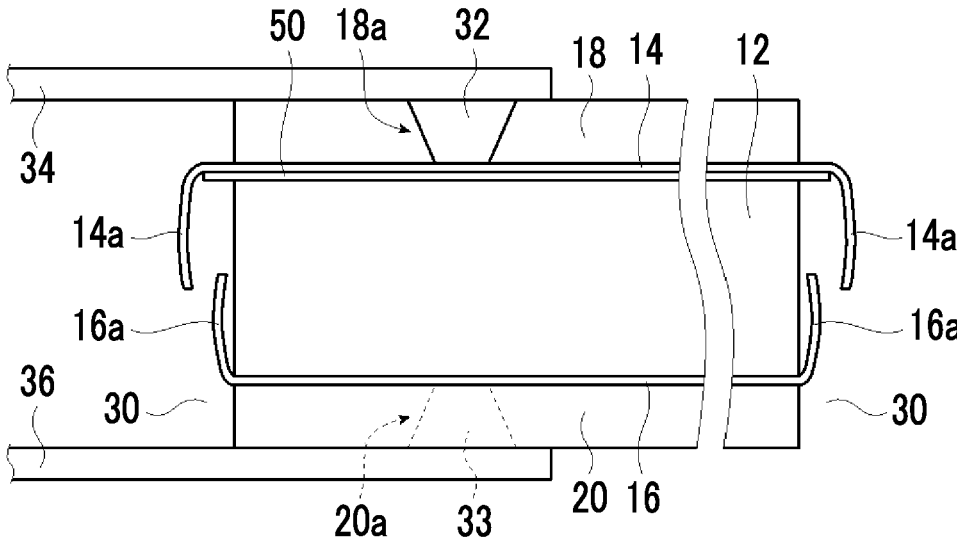
FIG. 13 is a view conceptually illustrating another example of the piezoelectric film.
Figure 14:
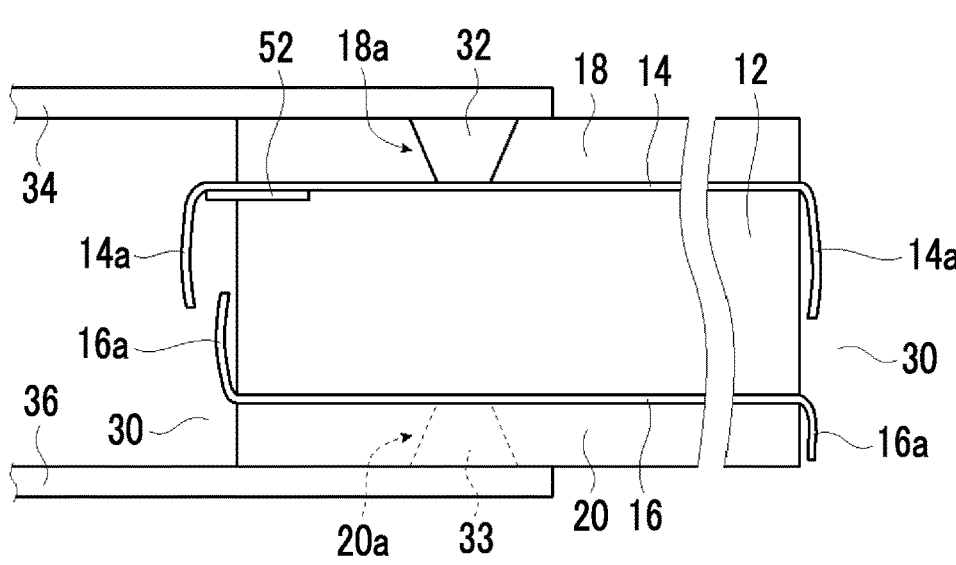
FIG. 14 is a view conceptually illustrating still another example of the piezoelectric film.

That is, in a case where the piezoelectric film including the laminated film consisting of the piezoelectric layer 12, the first electrode layer 14 and the second electrode layer 16 provided on both surfaces of the piezoelectric layer 12, and the first protective layer 18 and the second protective layer 20 formed on the surfaces of the electrode layers includes the above-described interlayer insulation member, the contact between the burr 14a of the first electrode layer 14 and the burr 16a of the second electrode layer 16 can be prevented even without providing the end surface coating layer 30, as conceptually illustrated in FIGS. 13 and 14.

Figure 15:
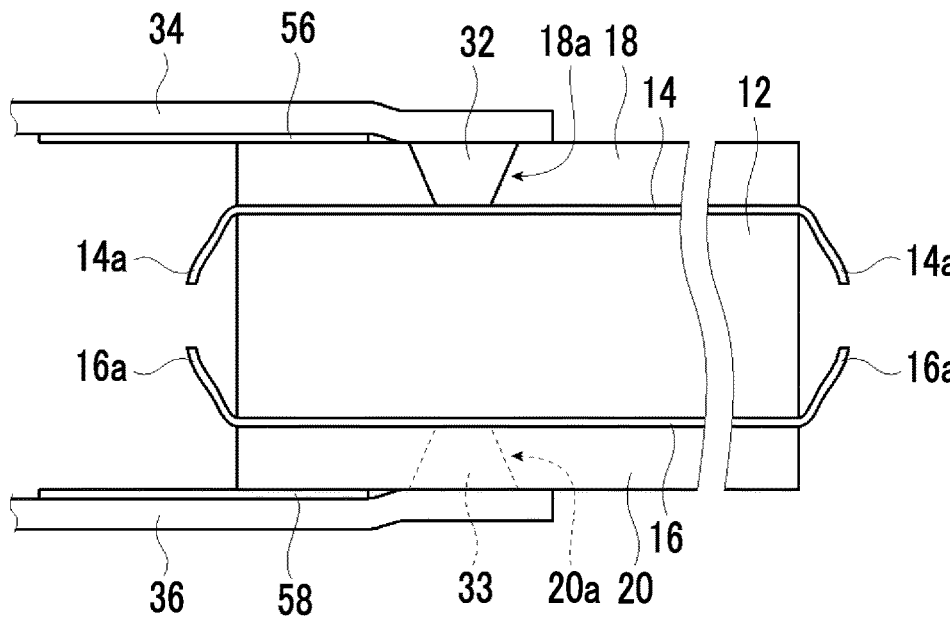
FIG. 15 is a view conceptually illustrating still another example of the piezoelectric film.

Further, in a case where the piezoelectric film including the laminated film includes the above-described electrode insulation members without having the end surface coating layer 30, the contact between the lead-out electrode and the burr of the electrode layer on the other side can be prevented even without providing the end surface coating layer 30, as conceptually illustrated in FIG. 15.

Figure 16:
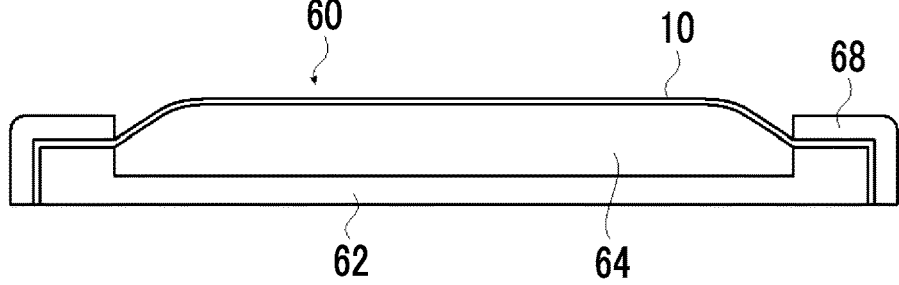
FIG. 16 is a view conceptually illustrating an example of a piezoelectric speaker formed of the piezoelectric film according to the embodiment of the present invention.

FIG. 16 is a conceptual view illustrating an example of a flat plate type piezoelectric speaker formed of the piezoelectric film 10 according to the embodiment of the present invention.

The piezoelectric speaker 60 is a flat plate type piezoelectric speaker that uses the piezoelectric film 10 according to the embodiment of the present invention as a vibration plate that converts an electrical signal into vibration energy. Further, the piezoelectric speaker 60 can also be used as a microphone, a sensor, or the like.

The piezoelectric speaker 60 is configured to have the piezoelectric film 10, a case 62, a viscoelastic support 64, and a frame 68.

The case 62 is a thin housing formed of plastic or the like and having one surface that is open. Examples of the shape of the housing include a rectangular parallelepiped shape, a cubic shape, and a cylindrical shape.

Further, the frame 68 is a frame material that has, in the center thereof, a through-hole having the same shape as the open surface of the case 62 and engages with the open surface side of the case 62.

The viscoelastic support 64 is a support used for efficiently converting the stretch and contraction movement of the piezoelectric film 10 into a forward and rearward movement (a movement in the direction perpendicular to the surface of the film) by means of having moderate viscosity and elasticity, supporting the piezoelectric film 10, and applying a constant mechanical bias to any place of the piezoelectric film. Examples of the viscoelastic support 64 include wool felt, nonwoven fabric such as wool felt containing PET, and glass wool. Further, a decompressed or pressurized gas can also be used instead of the viscoelastic support.

The piezoelectric speaker 60 is configured by accommodating the viscoelastic support 64 in the case 62, covering the case 62 and the viscoelastic support 64 with the piezoelectric film 10, and fixing the frame 68 to the case 62 in a state of pressing the periphery of the piezoelectric film 10 against the upper end surface of the case 62 by the frame 68.

Here, in the piezoelectric speaker 60, the viscoelastic support 64 has a shape in which the height (thickness) is larger than the height of the inner surface of the case 62.

Therefore, in the piezoelectric speaker 60, the viscoelastic support 64 is held in a state of being thinned by being pressed downward by the piezoelectric film 10 at the peripheral portion of the viscoelastic support 64. Similarly, in the peripheral portion of the viscoelastic support 64, the curvature of the piezoelectric film 10 suddenly fluctuates, and a rising portion that decreases in height toward the periphery of the viscoelastic support 64 is formed in the piezoelectric film 10. Further, the central region of the piezoelectric film 10 is pressed by the viscoelastic support 64 having a square columnar shape and has a (substantially) planar shape.

In the piezoelectric speaker 60, in a case where the piezoelectric film 10 is stretched in the in-plane direction due to the application of a driving voltage to the second electrode layer 16 and the first electrode layer 14, the rising portion of the piezoelectric film 10 changes the angle in a rising direction due to the action of the viscoelastic support 64 in order to absorb the stretched part. As a result, the piezoelectric film 10 having the planar portion moves upward.

On the contrary, in a case where the piezoelectric film 10 contracts in the in-plane direction due to the application of the driving voltage to the second electrode layer 16 and the first electrode layer 14, the rising portion of the piezoelectric film 10 changes the angle in a falling direction (a direction approaching the flat surface) in order to absorb the contracted part. As a result, the piezoelectric film 10 having the planar portion moves downward.

The piezoelectric speaker 60 generates a sound by the vibration of the piezoelectric film 10.

In the piezoelectric film 10 according to the embodiment of the present invention, the conversion from the stretching and contracting movement to vibration can also be achieved by holding the piezoelectric film 10 in a curved state.

Therefore, the piezoelectric film 10 according to the embodiment of the present invention can function as a piezoelectric speaker having flexibility by being simply maintained in a curved state instead of the piezoelectric speaker 60 having rigidity in a flat plate shape, as illustrated in FIG. 16.

The piezoelectric speaker formed of the piezoelectric film 10 according to the embodiment of the present invention can be stored in a bag or the like by, for example, being rolled or folded using the excellent flexibility. Therefore, with the piezoelectric film 10 according to the embodiment of the present invention, a piezoelectric speaker that can be easily carried even in a case where the piezoelectric speaker has a certain size can be realized.

Further, as described above, the piezoelectric film 10 according to the embodiment of the present invention has excellent elasticity and excellent flexibility, and has no in-plane anisotropy as a piezoelectric characteristic. Therefore, in the piezoelectric film 10 according to the embodiment of the present invention, a change in acoustic quality regardless of the direction in which the film is bent is small, and a change in acoustic quality with respect to the change in curvature is also small. Accordingly, the piezoelectric speaker formed of the piezoelectric film 10 according to the embodiment of the present invention has a high degree of freedom of the installation place and can be attached to various products as described above. For example, a so-called wearable speaker can be realized by attaching the piezoelectric film 10 according to the embodiment of the present invention to clothing such as a suit and portable items such as a bag in a curved state.

Further, as described above, the piezoelectric film according to the embodiment of the present invention can be used for a speaker of a display device by bonding the piezoelectric film to a display device having flexibility such as an organic EL display device having flexibility or a liquid crystal display device having flexibility.

As described above, the piezoelectric film 10 according to the embodiment of the present invention stretches and contracts in the plane direction in a case where a voltage is applied, and vibrates suitably in the thickness direction due to the stretch and contraction in the plane direction, and thus a sound with a high sound pressure can be output and excellent acoustic characteristics are exhibited in a case where the piezoelectric film 10 is used for a piezoelectric speaker or the like.

The piezoelectric film 10 according to the embodiment of the present invention, which exhibits excellent acoustic characteristics, that is, high stretch and contraction performance due to piezoelectricity is satisfactorily operated as a piezoelectric vibrating element that vibrates a vibration body such as a vibration plate by laminating a plurality of the piezoelectric films.

As an example, a speaker in which a laminate of the piezoelectric films 10 is bonded to the vibration plate and the vibration plate is vibrated by the laminate of the piezoelectric films 10 to output a sound may be used. That is, in this case, the laminate of the piezoelectric film 10 acts as a so-called exciter that outputs a sound by vibrating the vibration plate.

By applying a driving voltage to the laminated piezoelectric films 10, each piezoelectric film 10 stretches and contracts in the plane direction, and the entire laminate of the piezoelectric film 10 stretches and contracts in the plane direction due to the stretch and contraction of each piezoelectric film 10. The vibration plate to which the laminate has been attached is bent due to the stretch and contraction of the laminate of the piezoelectric film 10 in the plane direction, and thus the vibration plate vibrates in the thickness direction. The vibration plate generates a sound using the vibration in the thickness direction. The vibration plate vibrates according to the magnitude of the driving voltage applied to the piezoelectric film 10 and generates a sound according to the driving voltage applied to the piezoelectric film 10.

Therefore, the piezoelectric film 10 itself does not output sound in this case.

Even in a case where the rigidity of each piezoelectric film 10 is low and the stretching and contracting force thereof is small, the rigidity is increased by laminating the piezoelectric films 10, and the stretching and contracting force as the entire laminate is increased. As a result, in the laminate of the piezoelectric films 10, even in a case where the vibration plate has a certain degree of rigidity, the vibration plate is sufficiently bent with a large force and the vibration plate can be sufficiently vibrated in the thickness direction, whereby the vibration plate can generate a sound.

In the laminate of the piezoelectric film 10, the number of laminated piezoelectric films 10 is not limited, and the number of sheets set such that a sufficient amount of vibration is obtained may be appropriately set according to, for example, the rigidity of the vibration plate to be vibrated.

Further, one piezoelectric film 10 according to embodiment of the present invention can also be used as a similar exciter (piezoelectric vibrating element) in a case where the piezoelectric film has a sufficient stretching and contracting force.

The vibration plate vibrated by the laminate of the piezoelectric film 10 according to the embodiment of the present invention is not limited, and various sheet-like materials (such as plate-like materials and films) can be used.

Examples thereof include a resin film consisting of a resin material such as polyethylene terephthalate (PET) or the like, foamed plastic consisting of foamed polystyrene or the like, a paper material such as a corrugated cardboard material, a glass plate, and wood. Further, a device such as a display device may be used as the vibration plate in a case where the device can be sufficiently bent.

It is preferable that the laminate of the piezoelectric film 10 according to the embodiment of the present invention is obtained by bonding adjacent piezoelectric films with a bonding layer (bonding agent). Further, it is preferable that the laminate of the piezoelectric film 10 and the vibration plate are also bonded to each other with a bonding layer.

The bonding layer is not limited, and various layers that can bond materials to be bonded can be used. Therefore, the bonding layer may consist of a pressure sensitive adhesive or an adhesive. It is preferable that an adhesive layer consisting of an adhesive is used from the viewpoint that a solid and hard bonding layer is obtained after the bonding.

The same applies to the laminate formed by folding back the long piezoelectric film 10 described later.

In the laminate of the piezoelectric films 10, the polarization direction of each piezoelectric film 10 to be laminated is not limited. As described above, the polarization direction of the piezoelectric film 10 according to the embodiment of the present invention is the polarization direction in the thickness direction.

Therefore, in the laminate of the piezoelectric films 10, the polarization directions may be the same for all the piezoelectric films 10, and piezoelectric films having different polarization directions may be present.

Here, in the laminate of the piezoelectric films 10, it is preferable that the piezoelectric films 10 are laminated such that the polarization directions of the adjacent piezoelectric films 10 are opposite to each other.

In the piezoelectric film 10, the polarity of the voltage to be applied to the piezoelectric layer 12 depends on the polarization direction. Therefore, even in a case where the polarization direction is directed from the first electrode layer 14 toward the second electrode layer 16 or from the second electrode layer 16 toward the first electrode layer 14, the polarity of the first electrode layer 14 and the polarity of the second electrode layer 16 in all the piezoelectric films 10 to be laminated are set to be the same as each other.

Therefore, by reversing the polarization directions of the adjacent piezoelectric films 10, even in a case where the electrode layers of the adjacent piezoelectric films 10 come into contact with each other, the polarities of the electrode layers in contact with each other are the same as each other, and thus there is no risk of a short circuit.

The laminate of the piezoelectric film 10 may be configured such that a long piezoelectric film 10 is folded back, for example, once or more times, or preferably a plurality of times to laminate a plurality of layers of the piezoelectric films 10.

The structure in which the long piezoelectric film 10 is folded back and laminated has the following advantages.

That is, in the laminate in which a plurality of cut sheet-like piezoelectric films 10 are laminated, the first electrode layer 14 and the second electrode layer 16 need to be connected to a driving power supply for each piezoelectric film. On the contrary, in the configuration in which the long piezoelectric film 10 is folded back and laminated, only one sheet of the long piezoelectric film 10 can form the laminate. Further, in the configuration in which the long piezoelectric film 10 is folded back and laminated, only one power supply is required for applying the driving voltage, and the electrode may be led out from the piezoelectric film 10 at one place.

Further, in the configuration in which the long piezoelectric film 10 is folded back and laminated, the polarization directions of the adjacent piezoelectric films 10 are inevitably opposite to each other.

Hereinbefore, the piezoelectric film and the method of producing the piezoelectric film according to the embodiment of the present invention have been described in detail, but the present invention is not limited to the above-described examples, and various improvements or modifications may be made within a range not departing from the scope of the present invention.

Industrial Applicability

The piezoelectric film and the method of producing the piezoelectric film according to the embodiment of the present invention can be suitably applied to speakers, microphones, and the like.

EXPLANATION OF REFERENCES 10, 10A, 10B, 10C: piezoelectric film
12: piezoelectric layer
14: first electrode layer
14a, 16a: burr
16: second electrode layer
18: first protective layer
18a, 20a: through-hole
20: second protective layer
24: polymer matrix
26: piezoelectric particle
32: first connection member
33: second connection member 34: first lead-out electrode
36: second lead-out electrode
40: first laminate
42: second laminate
46: piezoelectric laminate
50, 52: interlayer insulation member
56: first electrode insulation member
58: second electrode insulation member
60: piezoelectric speaker
62: case
64: viscoelastic support
68: frame

What is claimed is:

1. A piezoelectric film comprising:
a laminated film which includes a piezoelectric layer, an electrode layer provided on each of both surfaces of the piezoelectric layer, and a protective layer covering the electrode layer; and
an insulating end surface coating layer which covers, on an end surface of the laminated film, from at least a part of the piezoelectric layer to at least a part of the protective layer.

2. The piezoelectric film according to claim 1, wherein the end surface coating layer covers the entire end surface of the laminated film.

3. The piezoelectric film according to claim 2, further comprising:
a conductive connection member which penetrates the protective layer and is connected to the electrode layer; and
a lead-out electrode which is electrically connected directly or indirectly to the conductive connection member and extends to an outside of the laminated film in a plane direction.

4. The piezoelectric film according to claim 3, further comprising:
an insulating electrode insulation member which is provided between the lead-out electrode and the laminated film and protrudes from an end portion of the laminated film.

5. The piezoelectric film according to claim 2, further comprising:
an insulating interlayer insulation member which is provided on at least a part of an end portion of the laminated film in at least one of a space between the piezoelectric layer and one electrode layer or a space between the piezoelectric layer and the other electrode layer.

6. The piezoelectric film according to claim 5, wherein at least a part of the interlayer insulation member protrudes from the end portion of the laminated film.

7. The piezoelectric film according to claim 5, wherein the interlayer insulation member is provided on the end portion of the laminated film on a side where the electrode is led out from the laminated film.

8. The piezoelectric film according to claim 5, wherein the interlayer insulation member is provided on the entire end portion of the laminated film.

9. The piezoelectric film according to claim 2, wherein the piezoelectric layer is a polymer-based piezoelectric composite material that contains piezoelectric particles in a matrix containing a polymer material.

10. The piezoelectric film according to claim 1, further comprising:
a conductive connection member which penetrates the protective layer and is connected to the electrode layer; and a lead-out electrode which is electrically connected directly or indirectly to the conductive connection member and extends to an outside of the laminated film in a plane direction.

11. The piezoelectric film according to claim 10, further comprising:

an insulating electrode insulation member which is provided between the lead-out electrode and the laminated film and protrudes from an end portion of the laminated film.

12. The piezoelectric film according to claim 1, further comprising:

an insulating interlayer insulation member which is provided on at least a part of an end portion of the laminated film in at least one of a space between the piezoelectric layer and one electrode layer or a space between the piezoelectric layer and the other electrode layer.

13. The piezoelectric film according to claim 12, wherein at least a part of the interlayer insulation member protrudes from the end portion of the laminated film.

14. The piezoelectric film according to claim 12, wherein the interlayer insulation member is provided on the end portion of the laminated film on a side where the electrode is led out from the laminated film.

15. The piezoelectric film according to claim 12, wherein the interlayer insulation member is provided on the entire end portion of the laminated film.

16. The piezoelectric film according to claim 1, wherein the piezoelectric layer is a polymer-based piezoelectric composite material that contains piezoelectric particles in a matrix containing a polymer material.

* * * * *